United States Patent
Issa et al.

(10) Patent No.: US 7,519,925 B2
(45) Date of Patent: *Apr. 14, 2009

(54) INTEGRATED CIRCUIT WITH DYNAMICALLY CONTROLLED VOLTAGE SUPPLY

(75) Inventors: Sami Issa, Phoenix, AZ (US); Uming Ko, Plano, TX (US); David Scott, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/139,452

(22) Filed: May 27, 2005

(65) Prior Publication Data

US 2005/0273742 A1 Dec. 8, 2005

Related U.S. Application Data

(60) Provisional application No. 60/577,295, filed on Jun. 4, 2004.

(51) Int. Cl.
*G06F 17/50* (2006.01)
(52) U.S. Cl. .................. 716/1; 716/4; 716/5; 716/6; 327/8; 327/21; 327/80; 327/81; 327/145; 327/149; 327/237
(58) Field of Classification Search .............. 716/1, 716/4–6, 18; 327/81, 21, 80, 145, 149, 237
See application file for complete search history.

(56) References Cited

U.S. PATENT DOCUMENTS

| | | | | | |
|---|---|---|---|---|---|
| 5,774,367 | A | * | 6/1998 | Reyes et al. | 716/2 |
| 6,166,577 | A | * | 12/2000 | Mizuno et al. | 327/278 |
| 6,944,834 | B2 | * | 9/2005 | Posat et al. | 716/1 |
| 7,024,568 | B2 | * | 4/2006 | Maksimovic et al. | 713/300 |
| 7,112,978 | B1 | * | 9/2006 | Koniaris et al. | 324/763 |
| 7,139,619 | B2 | * | 11/2006 | Martin et al. | 700/29 |
| 7,162,652 | B2 | * | 1/2007 | Issa et al. | 713/300 |
| 2003/0217337 | A1 | * | 11/2003 | Prewett et al. | 716/1 |

* cited by examiner

*Primary Examiner*—Vuthe Siek
*Assistant Examiner*—Nghia M Doan
(74) *Attorney, Agent, or Firm*—Wade J. Brady, III; Frederick J. Telecky, Jr.

(57) ABSTRACT

An electronic system (10). The system comprises circuitry ($P_1$) for receiving a system voltage from a voltage supply. The system also comprises circuitry ($14_1$), responsive to the system voltage, for providing data processing functionality. The circuitry for providing data processing functionality comprises a critical path ($CP_1$) and the critical path comprises a plurality of transistors. At least some transistors in the plurality of transistors have a corresponding predetermined voltage operating limit corresponding to a predicted lifespan. The system also comprises circuitry ($22_1$) for indicating a potential capability of operational speed of the critical path. The system also comprises circuitry (CB) for coupling the system voltage to the critical path. Lastly, the system also comprises circuitry (26) for adjusting the system voltage, as provided by the voltage supply, in response to the circuitry for indicating a potential capability. In selected instances, the circuitry for adjusting adjusts the voltage supplied by the voltage supply to be a voltage greater than the predetermined voltage operating limit while still complying with the predicted lifespan.

21 Claims, 4 Drawing Sheets

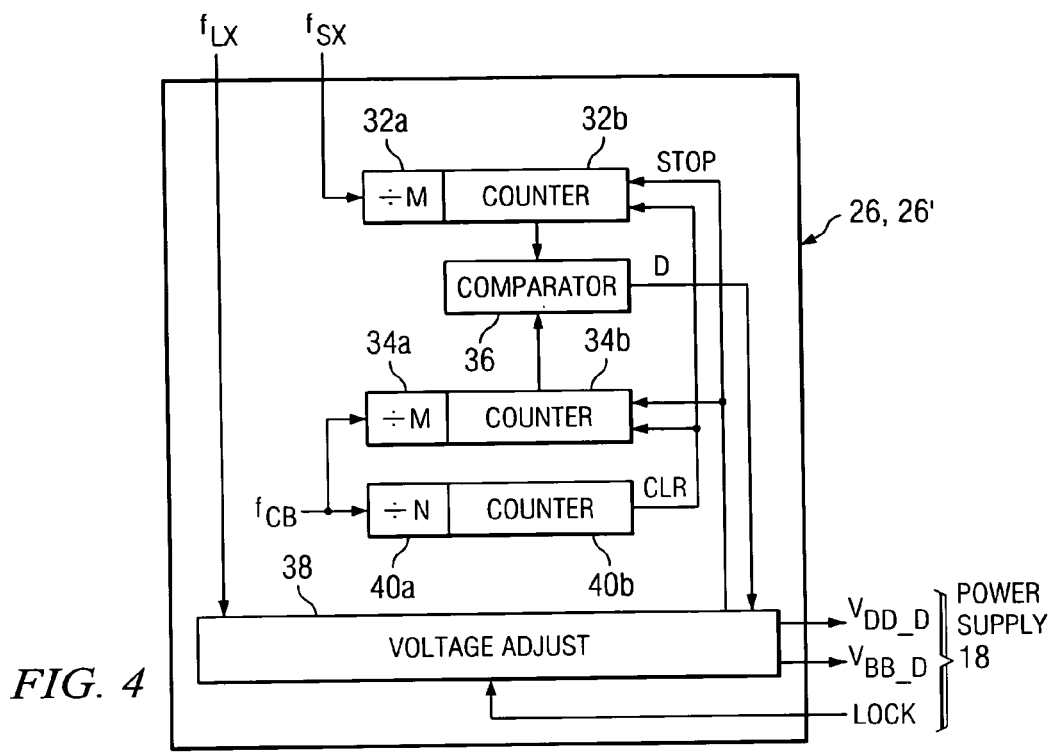
FIG. 4
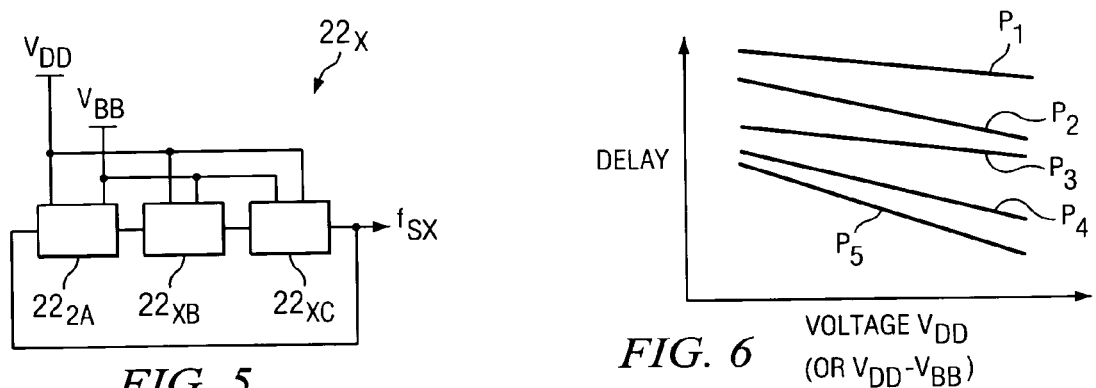
FIG. 5
FIG. 6
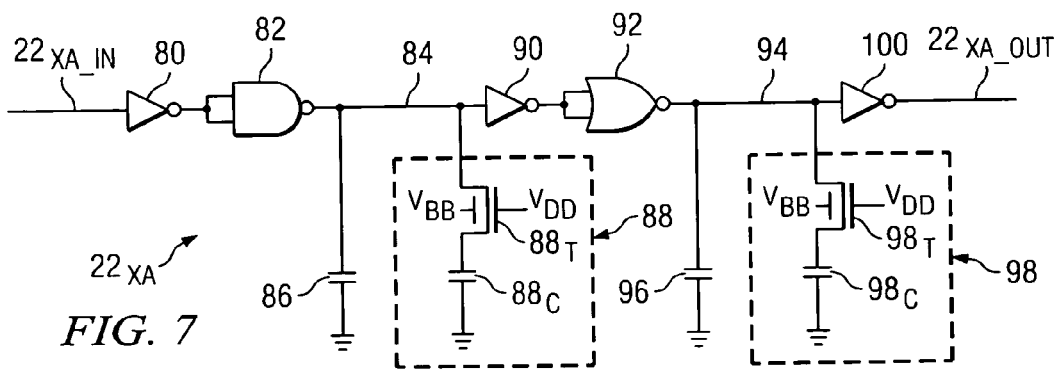
FIG. 7

INTEGRATED CIRCUIT WITH DYNAMICALLY CONTROLLED VOLTAGE SUPPLY

CROSS-REFERENCES TO RELATED APPLICATIONS

This application claims priority under 35 U.S.C. § 119 of U.S. Provisional Application No. 60/577,295 (TI-36834P), filed Jun. 4, 2004.

This application is related to U.S. Pat. No. 7,131,089 (TI-36578), entitled "Integrated Circuit Dynamic Parameter Management In Response To Dynamic Energy Evaluation", filed Dec. 18, 2003, and incorporated herein by this reference.

This application is related to U.S. Pat. No. 7,162,652 (TI-36581), entitled "Integrated Circuit Dynamic Parameter Management In Response To Dynamic Energy Evaluation", filed Dec. 18, 2003, and incorporated herein by this reference.

STATEMENT REGARDING FEDERALLY SPONSORED RESEARCH OR DEVELOPMENT

Not Applicable.

BACKGROUND OF THE INVENTION

The present embodiments relate to electronic circuits and are more particularly directed to an integrated circuit with a dynamically controlled voltage supply.

Electronic circuits are prevalent in numerous applications and are used in devices in personal, business, and other environments. Demands of the marketplace affect many design aspects of these circuits, including device size, complexity, efficiency, performance, and cost. These aspects are often important in various devices. By way of example, the mobile phone industry is transitioning from devices that are voice oriented to devices that are multimedia oriented, and multimedia applications typically integrate high performance processing cores. As a result, the above-mentioned aspects of size, complexity, efficiency, performance, and cost manifest themselves in various areas, including energy consumption, speed capability, and battery lifetime. These areas are also a concern in various other electronic devices, particularly where energy is a concern such as in other battery-powered applications. Thus, to maintain pace with marketplace demands and supplier goals for these devices, considerations with respect to these factors are of paramount interest. The preferred embodiments are directed to these aspects.

With the developments described above, integrated circuit, or "chip", design in the current state of the art often uses various criteria to determine a nominal level of voltage supply for the device, with a corresponding clock speed specification then determined from that nominal voltage supply. For example, some manufacturers develop a yield distribution curve, often in the shape of a Gaussian distribution (i.e., bell curve). Due to manufacturing variations, each chip in a group of chips will fall somewhere along this curve in terms of the quality of the overall silicon of the device. With this curve, for purposes of developing a speed specification for the entire group of chips, the weakest acceptable device is then tested with a power supply providing a voltage at which the device is predicted to perform over an acceptable period of time. For example, in current technology, such voltage may be on the order of 1.1 volts for a device, such as a digital signal processor, to operate reliably for a predicted period of seven years (where the use of seven years is only by way of example). This voltage, often referred to as the nominal voltage, is typically determined from various attributes of the device, such as the voltage susceptibility of the transistor gate oxides (or insulators) on the chip, as if often constrained by the gate oxide thickness. Thus, this nominal voltage becomes a constraint on the amount of voltage applied to all chips in the group. Moreover, once this nominal voltage is determined, it is used to determine the speed at which the weakest chip in the group can reliably perform, as further detailed below.

With the preceding, the present inventors recognize various drawbacks in the ultimate test-yielded speed specification that arises from testing a device with the nominal voltage, due to various allowances that must be made for variations and losses in the applied voltage. In one of these respects, the chip's voltage supply typically is a device external from the chip, and that voltage supply has a corresponding level of tolerance. For example, a voltage supply may be said to provide 1.1 volts, with a tolerance of 10%. Thus, the actual voltage provided by the supply may be anywhere in the approximate range of 1.0 volts to 1.2 volts. Accordingly, with the above voltage application and speed specification procedure, often the chip designer is required to assume a worst case scenario in terms of potential supply voltage, meaning in the present case the minus 10% voltage tolerance and a resultant output of the voltage supply of only 1.0 volts. In another respect, the prior art approach contemplates voltage loss between the power supply and the ultimate transistors of the chip's processing core(s). For example, the voltage supply as provided external from the chip traverses conductors between the voltage supply and the chip and they impart line losses due to the various attributes of the conductor lines (e.g., trace resistance and their tolerances). As another example, there may be line losses and tolerances internal to the chip, where those losses are incurred as the voltage is routed from the chip's external pins to the transistors of the chip's processing core(s). As still another example, temperature variations may cause a resistance change and, hence, a change in the voltage that ultimately reaches the chip's processing core(s).

As a result of the preceding, in the prior art the designer that is to determine a clock speed specification is often required to account for the worst case scenario for all of the possible voltage losses, by testing the corresponding chip core at a supply voltage level that includes all those losses. For instance, with a nominal voltage of 1.1 volts, then with these additional considerations there could be a worst-case-scenario loss of 0.2 volts before that nominal voltage reaches the processing core(s), coupled with the example above of 0.1 volt loss from the power supply tolerance. In this case, only 0.8 volts actually reaches the processing core(s). Thus, the designer applies this worst-case 0.8 volts directly to the chip core and evaluates the speed of operation that the core can reliably provide at that voltage. Of course, this speed will be less than that which would be achieved in an ideal (i.e., lossless) case, where 1.1 volts would be applied to the core. Thus, this resulting test-speed becomes the specification speed for the device. Hence, assuming the device is then used properly per its specification, it is thereafter implemented into a system by a vendor, installer, OEM or the like, and clocked at this worst-case speed while connected to the corresponding nominal voltage (e.g., 1.1 volts). Lastly, note that in one approach, a voltage supply with a smaller tolerance may be used so as to gain back some of the difference in test-confirmed clock speed as between the ideal case and the higher tolerance case, but of course a lower tolerance voltage supply is more costly and thereby increases the overall system cost.

As a final consideration with respect to the preceding, note that the prior art worst-case-scenario approach is often used to define the nominal voltage and test-confirmed clock speed as specifications for all chips in a group. Thus, chips in the same group, but that are better silicon than the weakest silicon device or that incur lesser losses than that anticipated in the worst-case scenarios, are necessarily constrained to perform at the test-confirmed clock speed in response to the nominal voltage as determined based on worst case conditions including the lesser performing chip. Thus, the above-described limitations are imposed on entire groups of chips rather than just single tested chips.

In view of the above, there is a need to further improve aspects relating to circuit and device performance control and energy efficiency. The preferred embodiments are directed to such improvements.

BRIEF SUMMARY OF THE INVENTION

In one preferred embodiment, there is an electronic system. The system comprises circuitry for receiving a system voltage from a voltage supply. The system also comprises circuitry, responsive to the system voltage, for providing data processing functionality. The circuitry for providing data processing functionality comprises a critical path and the critical path comprises a plurality of transistors. At least some transistors in the plurality of transistors have a corresponding predetermined voltage operating limit corresponding to a predicted lifespan. The system also comprises circuitry for indicating a potential capability of operational speed of the critical path. The system also comprises circuitry for coupling the system voltage to the critical path. Lastly, the system also comprises circuitry for adjusting the system voltage, as provided by the voltage supply, in response to the circuitry for indicating a potential capability. In selected instances, the circuitry for adjusting adjusts the voltage supplied by the voltage supply to be a voltage greater than the predetermined voltage operating limit while still complying with the predicted lifespan.

Other aspects are also disclosed and claimed.

BRIEF DESCRIPTION OF THE SEVERAL VIEWS OF THE DRAWING

FIG. 3b illustrates a timing diagram in connection with the operation of the block diagram of FIG. 3a.

FIG. 4 illustrates a functional block diagram of controller 26 and controller 26' of FIGS. 1 and 2, respectively.

FIG. 5 illustrates a block diagram of a general architecture that may be used to form speed each capability indicator $22_x$ of FIGS. 1 or 2 as a ring oscillator.

FIG. 6 illustrates a graph having voltage along its horizontal axis and delay along its vertical axis, where the graph depicts five plots to demonstrate different voltage/delay characteristics of five different respective data paths from which a critical path may be selected.

FIG. 7 illustrates a schematic of a preferred implementation for each blocks $22_{xA}$, $22_{xB}$, and $22_{xC}$ in FIG. 5.

DETAILED DESCRIPTION OF THE INVENTION

Figure 1:
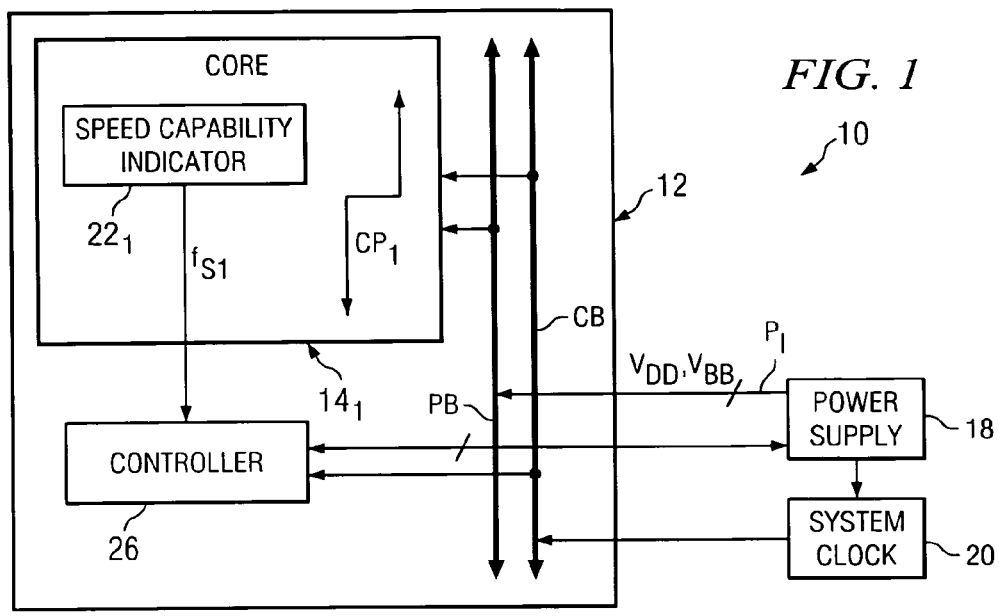
FIG. 1 illustrates a functional block diagram of a system 10 according to a preferred embodiment

FIG. 1 illustrates a functional block diagram of a system 10 according to a preferred embodiment. System 10 may represent any of various different types of electronic devices, where those devices provide functionality through the use of one or more integrated circuit devices. Indeed, as indicated in the preceding Background Of The Invention section of this document, the preferred embodiments have particular benefit in devices where power, performance, and energy consumption are considerations, such as in mobile phones and other battery-operated devices, so system 10 may represent a portion of any one of those devices. In other embodiments, system 10 has particular benefit where environmental variations may affect the usable amount of voltage applied to the critical path of the system circuitry. Still other applications will be ascertainable by one skilled in the art. In any event, in a general sense, various aspects and variations of system 10 are known in the art, where those variations are also contemplated as within the present inventive scope. Thus, the following first describes these known aspects by way of introduction, followed by a detailed discussion of aspects which in combination with the known aspects provide for the inventive preferred embodiments.

System 10 is shown by example to include one system-on-chip ("SOC") block 12, which represents a single integrated circuit device that encompasses various functionality. With respect to that functionality, and by way of example, SOC block 12 is shown to include a core $14_1$ representing an example of certain major functions associated with SOC block 12. For example, core 14, could be a general purpose microprocessor core or a digital signal processor ("DSP") core; however, alternative functioning blocks as well as a different number of functional blocks could be implemented and benefit from the inventive teachings of this document. In addition to core $14_1$, SOC block 12 may include additional functionality, such as supportive or ancillary functionality with respect to core $14_1$, as is shown later by example in an alternative embodiment.

Core $14_1$ is connected to receive a power supply voltage from a power supply 18, through a power bus PB as well as additional couplings or circuitry some of which is not expressly shown, but understood to be included such as an input pin $P_1$ as well as conductors from that pin to power supply 18 as well as internally in SOC block 12. In one approach, the same power supply voltage may be provided to different circuits via power bus PB, and in an alternative approach power bus PB may have multiple conductors whereby different voltages may be supplied to different circuits within SOC block 12. Power bus PB is intended to be connected in a manner to provide, from power supply 18, a general system bias voltage, $V_{DD}$, to the circuits to which it is connected. As known in the art, the system bias voltage, $V_{DD}$, may be connected to various devices, such as selected source, drain, and/or gate nodes of various transistors within system 10. In addition, however, and for reasons more evident below, power bus PB is also intended to be connected in a manner to provide, from power supply 18, a threshold voltage altering system back bias voltage, $V_{BB}$, to the back gates or other appropriate threshold voltage connections of at least some of the transistors in the various circuits to which power bus PB is connected. Further in this regard, while a single back bias voltage, $V_{BB}$, is shown, in the preferred embodiment two separate back bias voltages are provided, one for p-channel transistors and one for n-channel transistors, where as known in the art a different amount of voltage adjustment is required to cause an equal change in the threshold voltage of these different conductivity type devices. Note also that in the example of FIG. 1, power supply 18 is shown external from SOC block 12 as is common in contemporary applications. In this regard, the conductors between the external power supply 18 may cause some loss of voltage as $V_{DD}$ and/or $V_{BB}$ are coupled to SOC block 12, and to a lesser extent the conductors within SOC block 12 also may cause a loss in these voltages before the voltages ultimately reach core $14_1$. Further, in an alternative embodiment, and when feasible as may be ascertainable by one skilled in the art, power supply 18 may be integrated within the same single integrated circuit that forms SOC block 12. Lastly, while system voltages $V_{DD}$ and $V_{BB}$ are used in the typical manners of designating voltage, one skilled in the art will appreciate that other voltages may be provided as well as voltage differences, such as between a system voltage (e.g., $V_{DD}$) and a reference voltage (e.g., ground), and any of these voltages may be adjusted according to the inventive teachings as detailed below so as to adjust a net voltage applied to devices within core $14_1$.

Core $14_1$ is also connected to receive a system clock signal, via a clock bus CB and at a frequency $f_{CB}$, from a system clock 20. In general, the frequency of the system clock signal governs the speed of operation of the circuits receiving that signal. System clock 20 also receives a voltage supply from power supply 18. Also, as known in the art, the frequency of the clock signal $f_{CB}$ provided by system clock 20 to clock bus CB may be changed from time to time, typically under the control of the system operating system. Lastly, note by way of example that system clock 20 is shown to be external from SOC block 12, but in an alternative embodiment it may be integral within SOC block 12.

Turning now to aspects of SOC block 12 as distinguishable from the prior art, in the preferred embodiment core $14_1$ includes a speed capability indicator $22_1$ circuit, where that circuit is now introduced and as shown later where it provides enhanced performance control of system 10 in the form of improved energy savings and/or processing speed. Further, SOC block 12 includes a controller 26, which is coupled to receive a control signal $f_{S1}$ from speed capability indicator $22_1$ and is also connected to receive the system clock signal $f_{CB}$, via clock bus CB. Note that with certain variations as ascertainable by one skilled in the art and as illustrated by one example later, in alternative embodiments a different number of speed capability indicators and other device monitors may be implemented as within the present inventive scope.

Looking in detail to speed capability indicator $22_1$, it is constructed and operates in response to system voltages $V_{DD}$ and $V_{BB}$ to provide resultant voltage and speed characteristics that in general mimic the voltage and speed characteristics of the critical path in core $14_1$. More particularly, a critical path is identifiable in a core as is known in the art, such as through the use of various diagnostic software during the development of the core design. Typically, a critical path provides the most restrictive bottleneck to the data processing of a given circuit. For sake of illustration, such a critical path for core $14_1$ is shown generally as a critical path $CP_1$. In the preferred embodiment, with that core critical path $CP_1$ identified, speed capability indicator $22_1$ is designed and formed as a circuit that is preferably much smaller than critical path $CP_1$, where this smaller circuit that forms speed capability indicator $22_1$ operates in response to the same system voltages $V_{DD}$ and $V_{BB}$ as critical path $CP_1$, but where speed capability indicator $22_1$ is designed to repeatedly switch state at a rate that is responsive to those two system voltages. This switching rate, or frequency, or a signal responsive to it, is provided by an output signal that is a measure of that switching rate, where in one preferred embodiment the switching rate is output directly as an output frequency, $f_{S1}$, which as mentioned above is provided as a control signal to controller 26; in alternative embodiments, however, different measures of the switching rate may be provided, such as by outputting a digital count of or proportional to the switching rate. In any event, in the preferred embodiment wherein $f_{S1}$ is a frequency signal, the switching rate of $f_{S1}$ is governed by a feedback control in speed capability indicator $22_1$ and not the system clock $f_{CB}$ from clock bus CB. Thus, variations in $V_{DD}$ and/or $V_{BB}$ can affect $f_{S1}$, while $f_{S1}$, is not affected by the system clock from clock bus CB. Nonetheless, according to one preferred embodiment, and due to the attempt to match the characteristics of speed capability indicator $22_1$, with those of core critical path $CP_1$, then typically it is anticipated that the frequency capability of speed capability indicator 22, will mimic that of critical path $CP_1$ of core $14_1$, that is, for a given system voltage $V_{DD}$ and a given system back bias voltage $V_{BB}$, critical path $CP_1$ will be expected to operate at a frequency that is close to, or the same as, the switching frequency, $f_{S1}$, of speed capability indicator $22_1$. Further, in an alternative preferred embodiment, switching frequency, $f_{S1}$, gives a downward-scaled indication of critical path speed, so as to reduce power consumption of that indicator. For example, in one preferred embodiment, an explicit frequency divider may be included in speed capability indicator $22_1$ so as to reduce the resulting switching frequency, $f_{S1}$, which by way of example may be reduced to represent a speed that is 50% of that expected of critical path $CP_1$.

In the preferred embodiment, various aspects are implemented in an effort to ensure the likeness of voltage/frequency characteristics as between core critical path $CP_1$ and speed capability indicator $22_1$. As one aspect, in the preferred embodiment various design software, as available in the art, is operable to receive the network node listings or the like of critical path $CP_1$ and to provide a physically smaller design for speed capability indicator $22_1$, that is, for a smaller circuit that provides comparable voltage and frequency response to that of critical path $CP_1$. With respect to the size difference between critical path $CP_1$ and speed capability indicator $22_1$, for 65 nm technology, critical path $CP_1$ may be on the order of 500 µm in one dimension along an integrated circuit while speed capability indicator $22_1$ is by way of comparison on the order of 50 µm in one dimension along an integrated circuit; speed capability indicator $22_1$ is therefore less than or equal to approximately ten percent in size relative to critical path $CP_1$. Also using such software, in the preferred embodiment various iterations are repeated at the design stage so as to fine tune the voltage and frequency characteristics of speed capability indicator 22, to approach those of critical path $CP_1$ in core $14_1$, or scaled values thereof. In addition, however, in the preferred embodiment speed capability indicator $22_1$ is a tunable circuit, that is, provisions are made so that after it is implemented as a semiconductor device, additional tuning (or "trimming") may be made to the circuit so as to further refine its voltage/frequency characteristics to duplicate those of critical path $CP_1$ in core $14_1$. This ability to tune may be implemented in various manners as ascertainable by one skilled in the art, and indeed may be done in a manner such that digital tuning values can be loaded into speed capability indicator $22_1$ after fabrication so as to accomplish a high degree of precision in the ability to tune the circuit as well as to provide simplicity and compactness as compared to other methods of trimming (e.g., tunable capacitors). As another aspect, speed capability indicator $22_1$ is located proximate the corresponding critical path $CP_1$ in core $14_1$. For example, for 90 nanometer technology, then the distance between speed capability indicator $22_1$ and critical path $CP_1$ is preferably less than 100 μM As another aspect, in the preferred embodiment speed capability indicator $22_1$ is constructed to be approximately square in layout along the semiconductor device that forms SOC block 12. Note that the proximity and layout preferences are implemented in an effort to have the same factors, such as process and operational factors, comparably influence both critical path $CP_1$ in core $14_1$ and speed capability indicator $22_1$. For example, process variations, which cause peaks and valleys in operational aspects in both of the two dimensions laterally across the semiconductor device, will preferably influence both critical path $CP_1$ in core $14_1$ and speed capability indicator $22_1$ in a comparable manner. As another example, temperature variations will preferably influence both critical path $CP_1$ in core $14_1$ and speed capability indicator $22_1$ in a comparable manner. In any event, therefore, once speed capability indicator $22_1$ is properly tuned, it is thereafter anticipated that in ideal conditions it will switch state, as reflected in $f_{S1}$, at a rate that is the same as (or proportional to) the rate of operation for the corresponding core $14_1$. However, under non-ideal conditions, and as detailed later, the corresponding core $14_1$ may operate at a different rate (taking into any scaling, if applicable) than reflected in $f_{S1}$, and this difference forms a basis in the preferred embodiments by which operation may be adjusted to improve overall efficiency and/or performance. From the preceding considerations, therefore, one skilled in the art may readily ascertain various manners to design and fabricate speed capability indicator $22_1$. In addition to those ascertainable approaches, still additional considerations toward preferred embodiments for speed capability indicator $22_1$ are described later.

The operation of system 10 is now introduced with numerous details provided later for preferred embodiment implementations of such operation. In general, core $14_1$, outside of speed capability indicator $22_1$, operates as known in the art. Thus, by ways of example as a microprocessor or DSP, that device will perform various processing functionality along with related input/output, as governed in part by its critical path $CP_1$. At the same time, speed capability indicator $22_1$ provides the signal $f_{S1}$ to controller 26, thereby indicating a probable speed that core $14_1$, may achieve, given the voltage it currently is receiving and under ideal conditions, because speed capability indicator $22_1$ mimics core $14_1$. Further, recall the controller 26 also receives the actual system clock speed $f_{CB}$ from clock bus CB. Thus, controller 26 may determine a difference, described later in more detail as a difference D, that represents the difference between the actual clock speed $f_{CB}$ and the mimicked clock speed as represented in $f_{S1}$. This difference therefore provides a relative comparison between the performance as is being currently achieved due to the clocking of system clock 20 and that which could be achieved as provided by the mimicked value in $f_{S1}$. In response, controller 26 may cause an adjustment in the system voltages $V_{DD}$ and $V_{BB}$ in response to this analysis, where the adjustments are made by issuing counterpart digital voltage indication signals, $V_{DD\_D}$ and $V_{BB\_D}$, respectively to power supply 18 to cause it to adjust system voltages $V_{DD}$ and $V_{BB}$, respectively. In general and as appreciated from the following, these adjustments permit the overall operation of a core $14_1$ to be adjusted so as to improve the performance and/or efficiency, such as by providing a more optimal amount of energy consumption for a given system clock frequency or by providing an amount of voltage (or voltage difference) to be provided by power supply 18 in excess of what was anticipated or generally accepted according to the prior art. To appreciate these aspects in greater detail, the following provides various examples.

Consider a first example and assume that system 10 has specifications developed by the prior art, again using the earlier numbers of a nominal voltage of 1.1 volts (provided by power supply 18) and an operating frequency of 500 MHz (provided by system clock 20). One benefit of the added aspects of the preferred embodiment, as it relates to power efficiency, now may be appreciated. Thus, assume at a first time, $t_1$, power supply 18 is providing a voltage of 1.1 volts, system clock 20 is providing a frequency $f_{CB}$ of 500 MHz, and $f_{S1}$, as received by controller 26, indicates a speed capability of frequency at 600 MHz. Recall also that controller 26 determines a difference, D, between these two frequencies. According to the preferred embodiment, these frequencies and, thus, the difference, D, between them, effectively provide a comparison of the then-operating frequency of core $14_1$ (as caused by the system clock) with the potential capability of what frequency that core could operate at if clocked at a different speed as supported by the current value of $V_{DD}$ and/or $V_{BB}$, as reflected in $f_{S1}$; in other words, recall that $f_{S1}$ is provided by a speed capability indicator $22_1$ which is designed to mimic the voltage/frequency characteristics of core $14_1$ if it were operated independent of the system clock. In effect, therefore, for the present example, the 600 MHz indicated by $f_{S1}$ represents that system voltages $V_{DD}$ and $V_{BB}$ provide sufficient power to support a capability of 600 MHz of core operation due to the likeness of the core critical path relative to speed capability indicator $22_1$, even though the core at time $t_1$ is operating at 500 MHz. From this observation, therefore, it is effectively plausible that a lesser voltage may be used to support then then-required core operating frequency of 500 MHz, that is, the current states of the system voltages $V_{DD}$ and $V_{BB}$ as of time $t_1$ are sufficient to drive 600 MHz of operation, when at that time there is only the need to support 500 MHz of operation. As a result, controller 26 is made aware of these factors by way of the difference signal, D, and then it operates to cause an adjustment in one or both of the system voltages $V_{DD}$ and $V_{BB}$. Particularly in this regard, controller 26 provides digital values $V_{DD\_D}$ and $V_{BB\_D}$ to power supply 18, thereby causing power supply 18 to adjust $V_{DD}$ and/or $V_{BB}$, respectively, in proportion to the digital indications. In the present example, therefore, by causing a reduction in $V_{DD}$ and/or an increase in $V_{BB}$, controller 26 can continue to monitor the frequency signal $f_{S1}$ and the then-existing frequency of the system clock, as both will continue to be reflected by new determinations of the difference, D. Once the difference, D, is sufficiently low or reaches zero, then it is known that the frequency signal $f_{S1}$ is close to or matches the then-existing frequency of the system clock; at that point, therefore, controller 26 has provided an improved adjustment to $V_{DD}$ and/or $V_{BB}$, that is, that is, energy consumption has been reduced versus the state where the difference, D, is a larger or non-zero value, yet the critical path $CP_1$ and remainder of a core $14_1$ may continue to operate at a same 500 MHz frequency while consuming less energy.

Consider now a second example, where system 10 may operate in certain comparable respects as described above, but in the sense of a novel method that exceeds prior art nominal specifications. With a device having the same nominal voltage of 1.1 volts and a test-specification speed of 500

MHz as described in the immediately-preceding example, now assume that notwithstanding the specification, the clock speed as provided by system clock 20 is increased ten percent to 550 MHz. In other words, in this case, at a time $t_2$, the device is clocked at a speed greater than that specified as corresponding to the limit of the nominal voltage. Further, assume that at time $t_2$, some or all of the above contemplated voltage losses are incurred by device 10 and, thus, core 14$_1$ is only receiving 0.8 volts of the externally-supplied 1.1 volts. As a result of these conditions, speed capability indicator 22$_1$ indicates a corresponding speed to this reduced voltage of 0.8 volts and, hence, indicates a speed of only 500 MHz, as reported by $f_{S1}$ to controller 26—in other words, at this instant in time, speed capability indicator 22$_1$ indicates the 500 MHz speed that is expected and indeed specified as resulting from a nominal external voltage (e.g., 1.1 volts) that is subject to a worst-case scenario of voltage loss (e.g., 0.3 volts). In this inventive embodiment, however, controller 26 determines the difference, D, between the two frequencies of $f_{S1}$ and $f_{CB}$. In the present example, the $f_{CB}$ of 550 MHz exceeds the $f_{S1}$ of 500 MHz, indicating to controller 26 that additional voltage is desirable to support the clock operational speed $f_{CB}$ of 550 MHz. With the control connections from controller 26 to power supply 18, therefore, and because $f_{CB}$ exceeds $f_{S1}$ controller 26 operates not to adjust downward the voltage of power supply 18 as in the previous example, but instead it operates to increase upward the net voltage of power supply 18 (i.e., by either increasing $V_{DD}$ and or decreasing $V_{BB}$). Thus, whereas $V_{DD}$ was the nominal 1.1 volts at time $t_2$, after this adjustment it will be greater than 1.1 volts.

The evaluation of $f_{CB}$ and $f_{S1}$ and corresponding adjustment as described above in connection with the second example may be repeated numerous times until the difference, D, is sufficiently low or reaches zero. For example, the following Table 1 may describe four different adjustments to the voltage from power supply 18.

TABLE 1

| Time, $t_N$ | Condition set | $V_{DD}, V_{DDN}$ |
| --- | --- | --- |
| $t_2$ | 1 | $V_{DDt2} = V_{DD\_nom}$ |
| $t_3$ | 2 | $V_{DDt3} > V_{DDt2}$ |
| $t_4$ | 3 | $V_{DDt4} > V_{DDt3}$ |
| $t_5$ | 4 | $V_{DDt4} > V_{DDt5} > V_{DDt3}$ |

Looking in more detail at the example of Table 1, it lists four different condition sets, each corresponding to a different instance of time in which certain conditions are imposed on system 10, such as may occur from environment, the variability of its power supply due to its tolerance, and so forth. Condition set 1 corresponds to time $t_2$ described above, at which time the value of $V_{DD}$, abbreviated in Table 1 as $V_{DDt2}$ (by adding "t2" to the subscript), is equal to the nominal voltage, $V_{DD\_nom}$, for the device. As described above, at that point, $f_{CB}$ exceeds $f_{S1}$, so controller 26 causes power supply 18 to increase $V_{DD}$, to a value shown in Table 1 at time $t_3$ as $V_{DDt3}$. Thus, also as shown in Table 1, $V_{DDt3}$ therefore exceeds $V_{DDt2}$. At time $t_3$, the preferred method repeats for condition set 2, and assume again that $f_{CB}$ exceeds $f_{S1}$. In response, controller 26 again causes power supply 18 to increase $V_{DD}$, to a value shown in Table 1 at time $t_4$ as $V_{DDt4}$ and, as such $V_{DDt4}$ exceeds $V_{DDt3}$. However, assume as of time $t_4$, in response to condition set 4, that $f_{S1}$ exceeds $f_{CB}$. In response, controller 26 thereafter causes power supply 18 to decrease $V_{DD}$, to a value shown in Table 1 at time $t_5$ as $V_{DDt5}$; depending on the amount of adjustment, therefore, it is possible that $V_{DDt5}$ is therefore less than $V_{DDt4}$ while still exceeding $V_{DDt3}$. Moreover, assume thereafter that conditions remain relatively constant. During that time then it is known that the power supply 18 has been adjusted in a manner so at to adjust the frequency signal $f_{S1}$ to be close to or matching the then-existing frequency $f_{CB}$ of the system clock, while all the while providing a value of $V_{DD}$ that is greater than the nominal voltage for power supply 18 and therefore supporting a higher speed of operation for system 10 as compared to that achieved by the prior art.

From the preceding second example, note a key aspect of this preferred embodiment method and apparatus. Specifically, if the voltage losses discussed above with respect to the prior art approach for determining specifications are indeed occurring, such as by way of numeric example with a loss of 0.3 volts from power supply 18 to critical path $CP_1$, then indeed it is very likely that the control of controller 26 to power supply 18 will cause the actual voltage, or voltage difference, from power supply 18 to exceed the nominal voltage. In other words, controller 26 causes power supply 18 to provide a value of $V_{DD}$ greater than the predetermined voltage operating limit that is stated to comply with a predicted lifespan for the device. However, due to the losses that are occurring, the coupling of the higher voltage from power supply 18 to critical path $CP_1$ incurs a voltage drop and, thus, the actual voltage level reaching critical path $CP_1$ may still be at or less than the external nominal voltage. For example, if controller 26 causes power supply 18 to increase its output by 0.1 volts from 1.1 to 1.2 volts, then that external voltage is 0.1 volts greater than nominal. But, if there is a 0.3 volt loss during that time from coupling and other considerations, then only 0.9 volts reaches critical path $CP_1$. As a result, the voltage reaching critical path $CP_1$ is still less than the nominal 1.1 volts and, hence, complies with the predicted lifespan for the transistors in that critical path. Moreover, various manners may be imposed to limit controller 26 so that the voltage increase it causes in the voltage output by power supply 18 is such that the net voltage reaching critical path $CP_1$ does not exceed the nominal voltage for its transistors. For example, during testing, the nominal voltage may be applied to speed capability indicator 22$_1$, and the corresponding output $f_{S1}$, may be used as an upper limit such that controller 26 will not cause an output voltage that drives speed capability indicator 22$_1$ beyond that limit. Still other approaches may be ascertained by one skilled in the art. In any event, therefore, whereas the prior art was constrained by limiting the power supply voltage to a nominal level and setting a corresponding fixed limit for clock speed operation, the preferred embodiment permits clock speed to be increased beyond that which would be supported by the nominal voltage minus the anticipated worst-case-scenario voltage losses. Such a benefit may have a potentially large impact on the present state of the art. Specifically, numerous device and/or core designs exist in the art which have been given speed specifications according to an understanding of the above-described prior art voltage limitations. However, with the addition of the aspects of the preferred embodiment, those same designs may support greater device speeds without the requirement of a considerable re-design of the device or its sub-elements.

Figure 2:
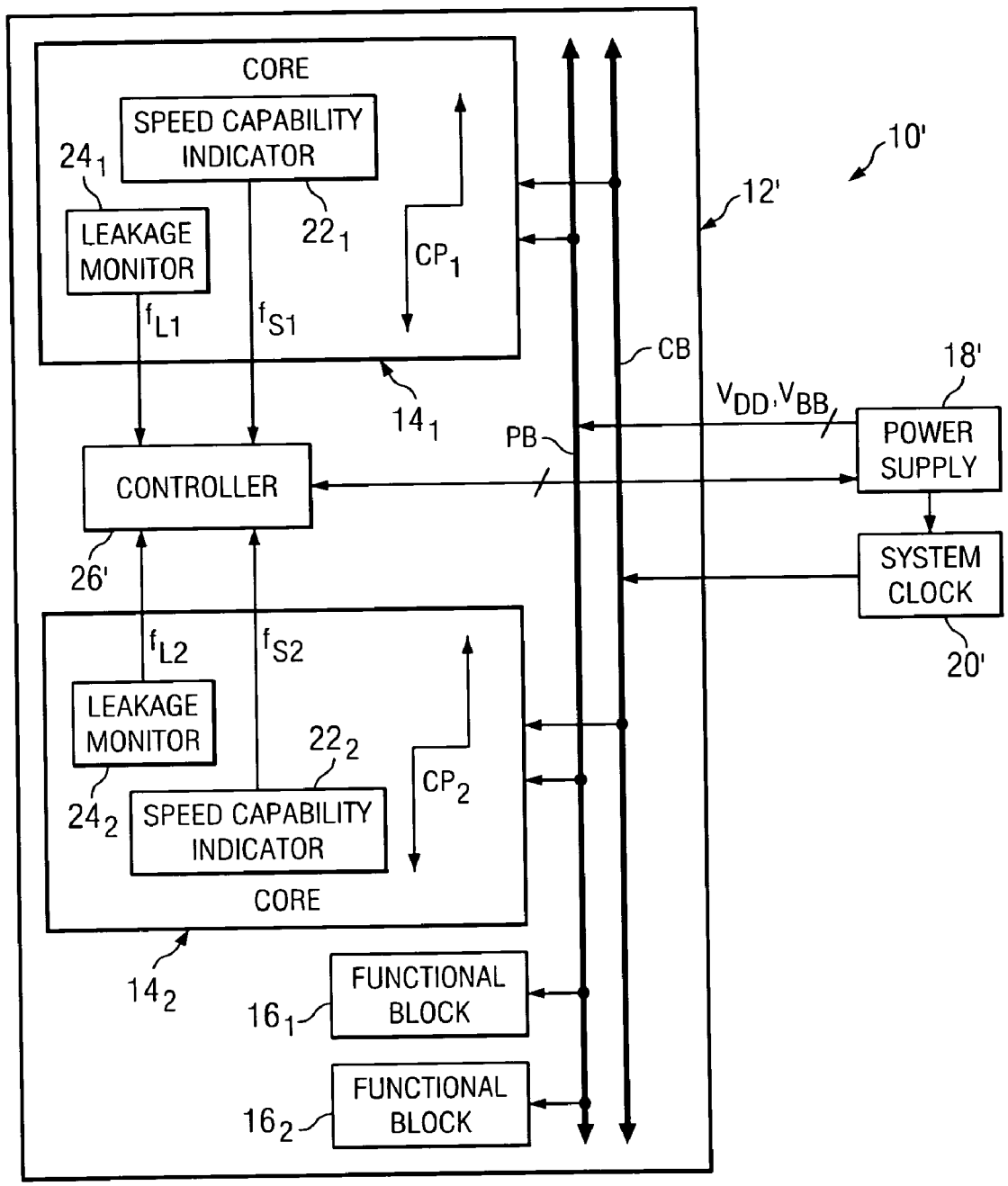
FIG. 2 illustrates a functional block diagram of a system 10' according to an alternative preferred embodiment.

FIG. 2 illustrates a functional block diagram of a system 10' according to an alternative preferred embodiment. System 10' includes certain of the same features and attributes of system 10 from FIG. 1 and, thus, to demonstrate certain of these matters like reference numbers are carried forward from FIG. 1 to FIG. 2, where apostrophes are added to certain of those numbers simply to permit a distinction in the present discussion from that above. Further, the reader is assumed familiar with the earlier discussion of system 10 of FIG. 1 and, thus, certain details pertaining to it are not repeated with respect to FIG. 2. Looking then to the additional aspects of system 10', its SOC block 12' is shown to include core 14₁, but in addition it includes a second and comparable core 14₂ having a corresponding critical path $CP_2$, where each core $14_x$ represents an example of certain major functions associated with SOC block 12. For example, core 14₁ could be a general purpose microprocessor core, while core 14₂ could be a DSP core; however, alternative functioning blocks as well as a different number of functional blocks could be implemented and benefit from the inventive teachings of this document. In addition to cores 14₁ and 14₂, SOC block 12' may include additional functionality, such as supportive or ancillary functionality with respect to cores 14₁ and 14₂. As an illustration in this regard, SOC block 12' is also shown to include two functional blocks 16₁ and 16₂, where the choice of two such blocks is solely by way of example.

Each functioning circuit of SOC block 12', including cores 14₁ and 14₂ and functional blocks 16₁ and 16₂, is connected to receive a power supply voltage from a power supply 18', through a power bus PB. In one approach, the same power supply voltage is provided to all of these circuits via power bus PB, and in an alternative approach power bus PB may have multiple conductors whereby different voltages may be supplied to different circuits within SOC block 12'. Power bus PB is intended to be connected in a manner to provide, from power supply 18', the general system bias voltage, $V_{DD}$, to the circuits to which it is connected, and again the threshold voltage altering system back bias voltage, $V_{BB}$, also may be provided from power supply 18'. For sake of simplicity, power supply 18' is only shown as providing one system value of $V_{DD}$ and one system value of $V_{BB}$. However, the preferred embodiments also contemplate, when feasible, providing different sets of $V_{DD}$ and $V_{BB}$, such as one set of $V_{DD}$ and $V_{BB}$ to core 14₁ and a separately adjustable and, thus, potentially different, set of $V_{DD}$ and $V_{BB}$ to core 14₂. Lastly, each functioning circuit of SOC block 12', including cores 14₁ and 14₂ and functional blocks 16₁ and 16₂, is connected to receive the system clock signal, $f_{CB}$, via a clock bus CB, from a system clock 20'.

Turning now to various aspects of SOC block 12' as distinguishable from the prior art, in the preferred embodiment each core $14_x$ includes two additional corresponding circuits, where each of those circuits is now introduced and as shown later where the combination of those circuits provides for enhanced performance control of system 10 in the form of energy savings and/or processing capability. A first additional circuit in each core $14_x$ is a speed capability indicator $22_x$, where each such speed capability indicator operates with respect to its core $14_x$ and provides a respective signal $f_{Sx}$ to controller 26 as detailed above in connection with speed capability indicator 22₁ of system 10. A second additional circuit in each core, however, is a leakage monitor $24_x$, and each leakage monitor provides a respective signal $f_{Lx}$ to controller 26. Thus, as detailed later, controller 26 is responsive not only to each speed capability indicator $22_x$, but in certain instances also may respond to each leakage monitor $24_x$ as well. Lastly, note that with certain variations as ascertainable by one skilled in the art, in alternative embodiments a different number of speed capability indicators and/or leakage monitors may be implemented as within the present inventive scope.

Looking in detail to speed capability indicator 22₂, it is constructed and operates in response to system voltages $V_{DD}$ and $V_{BB}$ to provide resultant voltage and speed characteristics that in general mimic the voltage and speed characteristics of the critical path $CP_2$ in core 14₂, as comparable to that described in connection with FIG. 1 and its speed capability indicator 22₁ relative to core 14₁. Thus, capability indicator 22₂ outputs its frequency signal, $f_{S2}$, which is governed by a feedback control in speed capability indicator 22₂ and not the system clock $f_{CB}$ from clock bus CB. Further, $f_{S2}$ indicates the capable speed of speed capability indicator 22₂ in response to one or both of the system voltages $V_{DD}$ and $V_{BB}$. Additional details are provided later as to a preferred construction of each speed capability indicator $22_x$.

Figure 3A:
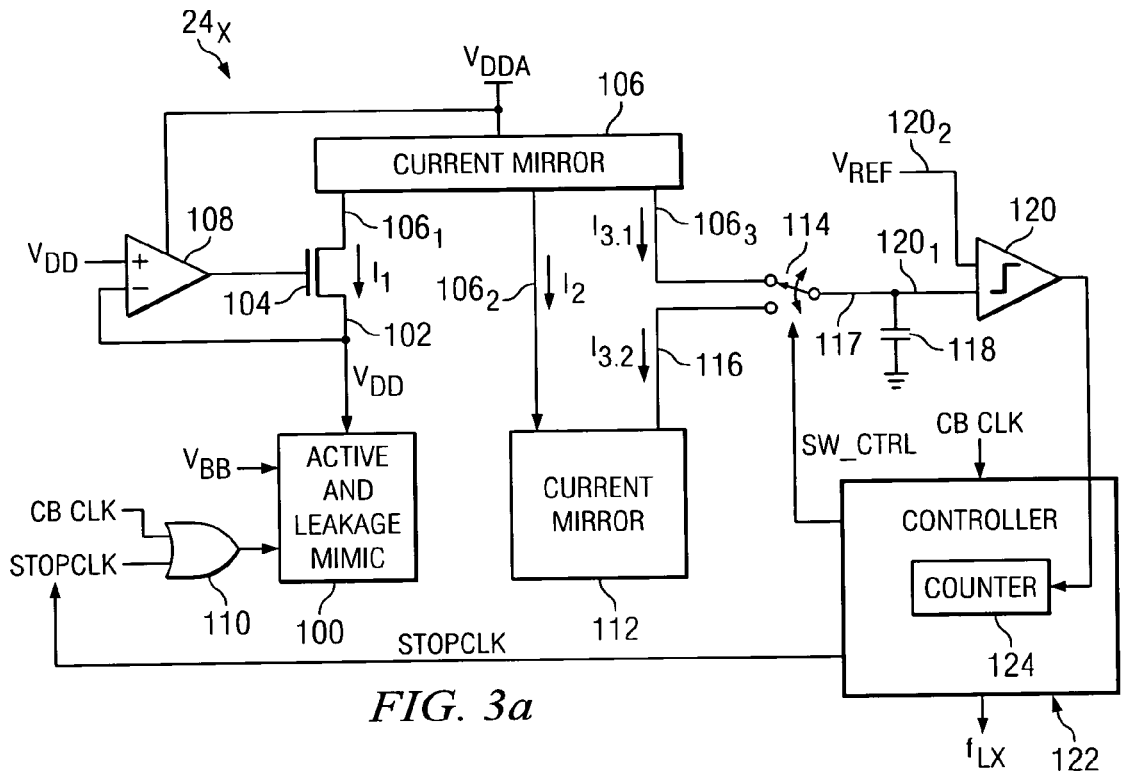
FIG. 3a illustrates a simplified block diagram of certain components that may be used to provide the functionality of either leakage monitor $24_1$ or $24_2$ of FIG. 2.

Looking in detail to leakage monitor 24₁, with the following details applying comparably to leakage monitor 24₂, it is constructed and operates to provide a signal indication, $f_{L1}$, representing the amount of current leakage in the corresponding core 14₁. By way of preferred examples, this leakage indication may be a signal, such as a signal having a frequency or a count, that is either proportional to the leakage directly or that provides a ratio of the leakage current relative to the active current. Such a leakage circuit may be designed by one skilled in the art. By way of example and as guidance in this endeavor, FIG. 3a illustrates a simplified example of a block diagram of certain components that may be used to provide such functionality, and since that block diagram may represent either leakage monitor 24₁ or 24₂, it is shown generally as a leakage monitor $24_x$. Leakage monitor $24_x$ includes an active and leakage mimic block 100, which is so named because it includes circuitry sufficient to mimic the active and leakage behavior of the corresponding core $14_x$ that monitor $24_x$ seeks to represent in terms of a leakage current indication. Note that the specific design for mimic block 100 in the preferred embodiment is preferably integrated into some part of the automated design of the corresponding circuit core, which in this regard is comparable to that of the design of a speed capability indicator $22_x$. In other words, for a given design and the software that produces it, that same software may be modified so as to produce, such as from the network list of the core design, a comparable design for a simplified circuit that produces leakage consistent with the corresponding core, where that circuit thus forms mimic block 100. Thus, for all integrated circuits sharing a same design, each will also share a comparable design of a corresponding mimic block 100 to be included in a leakage monitor $24_x$ (or multiple such monitors if more than one is desired). Mimic block 100 receives the same system bias voltage, $V_{DD}$, as provided to core $14_x$ (see FIG. 2) and from a node 102 that is connected to a source of an n-channel transistor 104. N-channel transistor 104 has its drain connected to an output 106₁ of a current mirror 106 and its gate connected to the output of an amplifier 108. The non-inverting input of amplifier 108 is connected to receive the system bias voltage $V_{DD}$ and the inverting input of amplifier 108 is connected in a feedback manner to node 102; thus, one skilled in the art will appreciate that this configuration therefore causes the voltage $V_{DD}$ at the non-inverting input to be duplicated at node 102. Returning to mimic block 100, it also preferably receives the system back bias voltage, $V_{BB}$, for application to desired back gates therein, and also a clock signal from an output of an OR gate 110. OR gate 110 has two inputs, the system clock signal CLK from bus CB (see FIG. 2, or described as $f_{CB}$ in connection with FIG. 1) and a STOPCLK signal, which is further described later.

Continuing the description of FIG. 3a, current mirror 106 receives a voltage source signal designated $V_{DDA}$, which preferably is the source supply for any related analog circuitry and which is also used to supply voltage to amplifier 108. Voltage $V_{DDA}$ is larger than $V_{DD}$ so as to properly achieve the functionality detailed later. Current mirror 106 includes another output 1062 connected to a current mirror 112 and another output 1063 that may be contacted by the switching end of a switch 114. The switching end of switch 114 also may be connected to a node 116 that is also connected to current mirror 112. Switch 114 is further connected to a node 117, where between node 117 and ground is connected a capacitor 118, and where node 117 is further connected to an input 120₁ of a comparator 120. A second input 120₂ of comparator 120 is connected to receive a reference voltage, $V_{ref}$. The output of comparator 120 is connected to a controller 122 and, more particularly, to control the starting and resetting of a counter 124 in controller 122. Controller 122 also receives the system clock CLK from clock bus CB, while it provides a switch control signal SW_CTRL to switch 114 and the STOPCLK signal to OR gate 110. Lastly, controller 122 outputs a signal $f_{Lx}$, which is intended to represent either $f_{L1}$ or $f_{L2}$ shown in FIG. 2, but is shown more generically as $f_{Lx}$ in FIG. 3a so as to correspond to the generic indication of the respective leakage monitor 24ₓ. Accordingly, $f_{Lx}$ may be monitored to provide a signal representing the amount of leakage current in monitor 24ₓ, as further appreciated below.

Figure 3B:
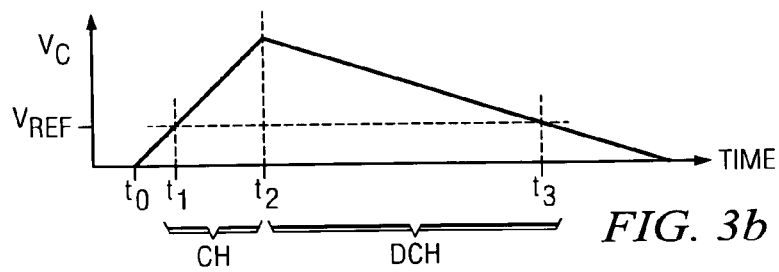

The operation of leakage monitor 24ₓ is now explored in connection with both FIGS. 3a and 3b. Introducing then FIG. 3b, it illustrates a plot of a voltage, $V_C$, across capacitor 118, over time. With transistor 104 operating, a current $I_1$ passes through its source/drain conductivity path. Initially, assume that the STOPCLK signal as input to OR gate 110 is deasserted low, so that OR gate 110 passes, to mimic block 100, the CLK signal at its other input; at this time, therefore, mimic block 110 mimics the active operation of a corresponding core 14ₓ and uses current $I_1$ as its active current. Further, the current $I_1$ is mirrored, by current mirror 106, at output 106₂ in the form of current $I_2$. Also at this time, assume that switch 114 is in its upward position, as shown in FIG. 3a. In response, current $I_2$ is mirrored, by current mirror 106, at output 106₃ in the form of current $I_{3.1}$; moreover, that current $I_{3.1}$ stores charge across capacitor 118 and, thus, the voltage $V_C$ across that capacitor begins to rise as shown following time $t_0$ in FIG. 3b. As $V_C$ rises, at a time $t_1$ it reaches and thereafter surpasses $V_{ref}$; at this time, comparator 120 outputs a first state to controller 122, thereby causing counter 124 to begin to count. In the preferred embodiment, counter 124 counts for a predetermined number of system clock CLK cycles, as shown as CH cycles between times $t_1$ and $t_2$ in FIG. 3b.

Continuing with the operation of leakage monitor 24₁, at time $t_2$, that is, after CH cycles of CLK, controller 122 asserts the STOPCLK signal high, resets the count in counter 124, and transitions the switch control signal SW_CTRL so that switch 114 moves to its downward position, that is, opposite of that shown in FIG. 3a. At this point, therefore, the assertion of STOPCLK causes OR gate 110 to present a constant high clock signal to mimic block 100, thereby holding it in one state. Thus, mimic block 100 at this point represents the state during stopped operation, that is, it will mimic the leakage of current through the corresponding core 14ₓ. Thus, the current $I_1$ now used by mimic block 100 is representative of current leakage through core 14ₓ. Moreover, again, current $I_1$ is mirrored, by current mirror 106, in the form of current $I_2$ to current mirror 112. Further, current $I_2$ is mirrored, by current mirror 112, in the form of current $I_{3.2}$, where the voltage $V_C$ across capacitor 118 begins to discharge at a rate reflected in current $I_{3.2}$. Thus, current $I_{3.2}$ is proportional to the leakage current through mimic block 100. During the time of discharge of voltage $V_C$ following time $t_2$, counter 124 accumulates a new count; once the voltage $V_C$ across capacitor 118 reaches and thereafter falls below $V_{ref}$ which is shown at time $t_3$ in FIG. 3b, then comparator 120 changes its output state, thereby stopping the count in counter 124. The total count in counter 124 at time $t_3$ is referred to herein as M counts. Thus, by time $t_3$, leakage monitor 24ₓ is informed of the time (CH cycles) for capacitor 18 to charge to a certain voltage during active current usage as well as the time (DCH cycles) for capacitor to discharge from that certain voltage during leakage current usage. Given the preceding, one skilled in the art will appreciate that a ratio may be provided between the N counts and the M counts, with the result providing a relative indication of the active use current relative to the leakage current. This ratio is provided by the signal $f_{Lx}$ and, thus, indicates an amount of current leakage in mimic block 100 and, hence, also in core 14ₓ. Thus, the ratio is effectively a digital value, converted from the analog provision of mirrored currents, to represent leakage current. Further, while FIG. 3a illustrates one such approach, one skilled in the art may ascertain various alternatives.

Returning to FIG. 2 and applying the observations from FIGS. 3a and 3b to a core 14ₓ, then according to the preferred embodiment each leakage monitor 24ₓ preferably operates in a similar capacity, that is, to provide a signal that is either directly or proportionally relating to an amount of current leakage in the respective core 14ₓ. Particularly, note that mimic block 100 is preferably designed and located in manner to reflect a comparable amount of leakage as the leakage that is then occurring in the remaining functional transistors in the corresponding core 14ₓ. In other words, given the relatively small space in which a core 14ₓ is constructed and the large number of transistors therein as well as the various different possible functions of different ones of those transistors, then at any given time some percentage of the overall number of transistors will be in a non-conducting and non-switching state, and those transistors will leak current, thereby causing a commensurate amount of power consumption. Mimic block 100 is therefore designed and constructed to reflect a proportionate indicator of the amount of this leakage current and, therefore, the signal $f_{Lx}$ represents not only the amount of current leakage within a leakage monitor 24ₓ, but it likewise represents the amount of current leakage in the corresponding core 14ₓ. Still further, while separate leakage monitors 24₁ and 24₂ are shown in the preferred embodiment, in an alternative preferred embodiment a single such monitor may be provided for the entire SOC block 12', or as still other embodiments more than two such monitors may be included. Lastly, note that the signal $f_{Lx}$ may be provided in various forms. In one form, it may have a frequency, where the amount of signal transitions over a period of time may be counted and the magnitude of the count thereby provides a digital representation proportional to the amount of current leakage. In another form, the signal may be a ratio between current leakage and active leakage, as discussed above in connection with FIGS. 3a and 3b.

Turning now to FIG. 4, it illustrates controller 26 (FIG. 1) or controller 26' (FIG. 2) in detail, which preferably are constructed and operate to process the signals, $f_{Sx}$ and $f_{Lx}$, from both sets of speed capability indicators 22₁ and 22₂ and leakage monitors 24₁ and 24₂. For sake of discussion, however, the following discussion first considers controller 26' as considering only one set of $f_{Sx}$ and $f_{Lx}$ from the speed capability indicators 22ₓ and leakage monitor 24ₓ of a single core 14ₓ, where a later discussion contemplates the processing of those signals from both core 14₁ and 14₂. Turning to the details of FIG. 4, frequency signal $f_{Sx}$ is connected as an input to a divider 32a that divides the frequency of that signal by a value M, and the result is provided to a counter 32b. The system clock signal $f_{CB}$ is connected, from clock bus CB, as an input to a divider 34a that divides the frequency of that signal by the same value M as used by divider 32a, and the result is provided to a counter 34b. The counts from both of counters 34a and 34b are connected as inputs to a comparator 36. Comparator 36 compares these count values to one another so in effect comparator 36 is comparing a measure of the frequency signal representing the speed capability (i.e., counter 32b) with a comparable measure the frequency of the system clock (i.e., counter 34b), where the comparison is simplified by comparing a scaled version (i.e., scaled by M) of each of these values. Note also that if frequency signal $f_{Sx}$ is scaled, as described above, by applying including a frequency divider in speed capability indicator $22_x$, then an appropriate modification is made, such as by doubling the count in counter 32b if a 50% reduction is made in the output of $f_{Sx}$ to correspond to the divider in speed capability indicator $22_x$. In any event, in response to its comparison, comparator 36 outputs a difference signal, D, indicating the difference between the counts in counters 32b and 34b. In an alternative embodiment counters 32b and 34b and comparator 36 are replaced with an up-down counter, whereby frequency signal $f_{Sx}$ causes an advancement of the up-down counter in one direction (e.g., increment), while the system clock from clock bus CB causes an advancement of the up-down counter in the opposite direction (e.g., decrement). As a result, the ultimate count in such an up-down counter also represents the difference signal, D.

Turning to the response to the difference signal, D, it is connected as an input to a voltage adjust circuit 38, which also receives as an input the signal, $f_{Lx}$, from the corresponding leakage monitor $24_x$. Voltage adjust circuit 38 may be constructed by one skilled in the art to achieve the functionality described in this document, with such construction being selected from various different combinations of available hardware and/or software, including by way of example a state machine in combination with circuitry (e.g., digital filter) to respond to the various inputs and to provide the described outputs. Also in this regard, voltage adjust circuit 38 is shown to provide two digital voltage indication signals, $V_{DD\_D}$ and $V_{BB\_D}$, to power supply 18, where as shown below these signals can cause changes in the power supply voltages $V_{DD}$ and $V_{BB}$, respectively. Moreover, with respect to the latter digital signal, $V_{BB\_D}$, recall from earlier that the preferred embodiment provides one back bias voltage to the p-channel transistors and another back bias voltage to the n-channel transistors in each core $14_x$. Consistent with these two voltages, therefore, in the preferred embodiment the digital signal $V_{BB\_D}$ includes two different digital signals, one to correspond to the back bias voltage for the p-channel transistors and one to correspond to the back bias voltage for the n-channel transistors. Voltage adjust circuit 38 also receives a LOCK signal from power supply 18. Finally, controller 26 includes an additional divider 40a that also receives the system clock signal from clock bus CB, and divider 40a divides the frequency of that signal by a value N; the result is provided a to a counter 40b, which is operable to provide a clear signal ("CLR") and a STOP signal to both counters 32b and 34b.

The preferred operation of controller 26' is now discussed, where a portion of this discussion also may be applied with respect to controller 26 of FIG. 1 insofar as signal $f_{S1}$ alone is concerned as well as the response thereto. Counter 40b governs each cycle of operation for controller 26' by counting toward a threshold, where this may be achieved by using a decrementing counter which reaches a threshold of zero or by using a wraparound (or modulo) counter that is considered to reach a threshold each time it returns to zero or some other value. In any event, when counter 40b reaches its threshold, the CLR signal is asserted thereby clearing the values in both counters 32b and 34b, after which both counters being counting in response to their respective inputs. The periodicity of CLR being asserted to periodically clear the counters in this manner is adjustable by the value of N given the then-existing clock frequency provided by clock bus CB. For example, if the system clock is at 250 MHz, and N=10, then counter 40b counts at 25 MHz. With this counting rate, a threshold is associated with counter 40b such that once the threshold is reached, CLR is asserted. At the same time, which therefore also continues after counters 32b and 34b are cleared, speed capability indicator $22_x$ reports a frequency $f_{Sx}$, which recall represents the speed, either directly or scaled downward, at which the relatively small circuit in that indicator transitions (or "oscillates") at the then-existing voltages for $V_{DD}$ and $V_{BB}$, and that frequency is scaled downward by M and counted by counter 32b. For example, assume during this time period that given the then-existing $V_{DD}$ and $V_{BB}$, frequency $f_{Sx}$=500 MHz, and assume M=5, then counter 32b counts at a rate of 100 MHz. During the same time, the system clock signal provided by clock bus CB is scaled by M and that frequency is counted by counter 34b. For example, continuing with the assumption that the system clock is at 250 MHz, then counter 34b counts at a rate of 50 MHz (i.e., 250 MHz/5=50 MHz). At some point, also determined by the count in counter 40b, STOP is asserted and the counts in counters 32b and 34b are compared by comparator 36. In the present example, because the count rate of those counters are 100 MHz and 50 MHz, respectively, then the count in counter 32b will be twice that of the count in counter 34b. Thus, these values are compared by comparator 36 and the resulting difference, D, is provided to voltage adjust circuit 38.

In the preferred embodiment, voltage adjust circuit 38 is operable to analyze the difference, D, either alone or in combination with the leakage signal $f_{Lx}$, and to cause an adjustment in the system voltages $V_{DD}$ and $V_{BB}$ in response to this analysis, where the adjustments are made by issuing counterpart digital voltage indication signals, $V_{DD\_D}$ and $V_{BB\_D}$, respectively. In general, these adjustments permit the overall operation of a corresponding core $14_x$ to be adjusted so as to improve the performance efficiency, such as by providing a more optimal amount of energy consumption for a given system clock frequency or by increasing system voltage beyond a nominal value to exceed previously-specified clock speeds as discussed in connection with FIG. 1. To appreciate these aspects in greater detail, consider an example where only $f_{S1}$ is considered (and hence the leakage signal $f_{Lx}$ is not considered). Further, assume at a first time, $t_1$, $f_{Sx}$, as processed through counter 32b, indicates a speed capability of frequency at 500 MHz, while at the same time assume that the system clock frequency, as processed through counter 34b, indicates a then-existing core operational frequency of 250 MHz; recall also that the difference between these two frequencies, after scaling, is reflected in the difference signal, D, to voltage adjust circuit 38. According to a preferred embodiment, these frequencies and, thus, the scaled difference, D, between them, effectively provide a comparison of the then-operating frequency of core $14_x$ (as caused by the system clock) with the potential capability of what frequency that core could operate at if left to transition freely in response to $V_{DD}$ and $V_{BB}$, as reflected in $f_{Sx}$; in other words, recall that $f_{Sx}$ is provided by a speed capability indicator $22_x$ which is designed to mimic the voltage/frequency characteristics of core $14_x$ if it were operated independent of the system clock. In effect, therefore, for the present example, the 500 MHz indicated by $f_{Sx}$ represents that system voltages $V_{DD}$ and $V_{BB}$ provide sufficient power to support a capability of 500 MHz of core operation due to the likeness of the core critical path relative to speed capability indicator $22_x$, even though the core at time $t_1$ is operating at 250 MHz. From this observation, therefore, it is effectively plausible that a lesser voltage may be used to support then-required core operating frequency of 250 MHz, that is, the current states of the system voltages $V_{DD}$ and $V_{BB}$ as of time $t_1$ are sufficient to drive 500 MHz of operation, when at that time there is only the need to support 250 MHz of operation. As a result, since voltage adjust circuit 38 is made aware of these factors by way of the difference signal, D, then voltage adjust circuit 38 operates to cause an adjustment in one or both of the system voltages $V_{DD}$ and $V_{BB}$. Particularly in this regard, voltage adjust circuit 38 provides digital values $V_{DD\_D}$ and $V_{BB\_D}$ to power supply 18, thereby causing power supply 18 to adjust $V_{DD}$ and $V_{BB}$, respectively, in proportion to the digital indications. In the present example, therefore, by causing a reduction in $V_{DD}$ and/or an increase in $V_{BB}$, voltage adjust circuit 38 can continue to monitor the frequency signal $f_{Sx}$ and the then-existing frequency of the system clock, as both will continue to be reflected by new determinations of the difference, D. Once the difference, D, is sufficiently low or reaches zero, then it is known that the frequency signal $f_{Sx}$ is close to or matches the then-existing frequency of the system clock; at that point, therefore, voltage adjust circuit 38 has provided an improved adjustment to $V_{DD}$ and/or $V_{BB}$, that is, that is, energy consumption has been reduced versus the state where the difference, D, is a larger or non-zero value, yet the critical path of a core 14$_x$ may continue to operate at a same frequency while consuming less energy.

In the preferred embodiment, the operation of controller 26' may complete for one adjustment and then repeat for additional adjustments. Specifically, once an adjustment is made, CLR is asserted, thereby clearing both counters 32*b* and 40*b*. Thereafter, STOP is de-asserted and those counters again begin counting, again in response to $f_{Sx}$ and the system clock on clock bus CB, respectively. Next, the above-described methodology is repeated, that is, STOP is asserted and the difference signal, D, is determined. Accordingly, in the preferred embodiment this entire process may be repeated numerous times (or indefinitely) while system 10 is operating. Consequently, there is an ongoing, periodic, and dynamic evaluation of the difference, D, at different times, with each instance representing a potential adjustment to $V_{DD}$ and $V_{BB}$ in response to that difference. As a result, there is continuous management and optimizing of the energy consumption of system 10'.

While the preceding has demonstrated considering a single value of $f_{Sx}$ from a single speed capability indicator 22$_x$, recall in FIG. 2 that controller 26' is connected to receive multiple values of $f_{Sx}$ from respective multiple speed capability indicators 22$_x$. With these connections, various alternatives are contemplated within the present inventive scope. In one approach, controller 26' may operate to cause local voltages for $V_{DD}$ and $V_{BB}$ to be supplied to different local cores, that is, one set of $V_{DD}$ and $V_{BB}$ may be caused to be supplied to core 14$_1$ based on its speed capability indicator frequency $f_{S1}$, while another set of $V_{DD}$ and $V_{BB}$ may be caused to be supplied to core 14$_2$ based on its speed capability indicator frequency $f_{S2}$. However, in some implementations, the use of different values of $V_{DD}$ (and $V_{BB}$) for a single chip such as SOC block 12' may prove too complex or otherwise undesirable, and thus instead controller 26' may implement some type of optimization as between receiving multiple values of $f_{Sx}$. For example, a conservative approach may be, in the instance of receiving multiple values of $f_{Sx}$, determining the difference, D, based on the value of $f_{Sx}$ that is closest to the clock frequency; in this manner, any subsequent adjustment will optimize toward that value, without over adjusting which might occur if the value of $f_{Sx}$ that were more distant from the clock frequency were used. Other manners of optimizing any adjustment, based on multiple values of $f_{Sx}$, may be ascertained by one skilled in the art.

Recalling that voltage adjust circuit 38 is also operable to analyze the difference, D, in combination with the leakage signal $f_{Lx}$, two examples in that regard are now explored. As a first example, assume at a time $t_3$ that $f_{Sx}$ indicates a speed capability of frequency at 500 MHz, while at the same time assume that the system clock frequency indicates a then-existing core operational frequency of 250 MHz, and again the scaled difference between these two frequencies is reflected in the difference signal, D, to voltage adjust circuit 38. Assume further that the leakage signal, $f_{Lx}$, indicates a relatively small amount of current leakage. With respect to this latter indication, note that a threshold (or more than one threshold) may be established as a basis of comparison to the leakage signal, $f_{Lx}$, such that if $f_{Lx}$ is below the threshold, then leakage is considered low, whereas if $f_{Lx}$ is above the threshold, then leakage is considered high. Returning then to the example wherein leakage is low, then preferably voltage adjust circuit 38 again provides digital values $V_{DD\_D}$ and $V_{BB\_D}$ to power supply 18', thereby causing corresponding voltage outputs from power supply 18' of $V_{DD}$ and $V_{BB}$; however, since leakage is low, the preferred embodiment directs a larger reduction in the magnitude of $V_{DD}$ (by changing $V_{DD\_D}$) as compared to the increase in the magnitude of $V_{BB}$ (by changing $V_{BB\_D}$). Indeed, having detected relatively low leakage, it may be preferable to only reduce $V_{DD}$ while leaving $V_{BB}$ unchanged. The preference of a greater adjustment to $V_{DD}$ versus $V_{BB}$ arises from the observation that by considerably increasing $V_{BB}$, the threshold voltage of the transistors affected may be such that additional leakage may be possible, which would be undesirable. Thus, the more dominant (or sole) change in this example is made by reducing $V_{DD}$. In contrast, assume as another example, at a time $t_4$, that the frequencies are the same as were the case at $t_4$ (i.e., system clock of 250 MHz, $f_{Sx}$=500 MHz), but at $t_4$ assume that the leakage signal, $f_{Lx}$, indicates a relatively large amount of current leakage. In this case, then preferably voltage adjust circuit 38 again provides digital values $V_{DD\_D}$ and $V_{BB\_D}$ to power supply 18', but since leakage is relatively high, the preferred embodiment directs a larger increase in the magnitude of $V_{BB}$ (by changing $V_{BB\_D}$) as compared to the decrease in the magnitude of $V_{DD}$ (by changing $V_{DD\_D}$). Indeed, it may be preferable to only increase $V_{BB}$ while leaving $V_{DD}$ unchanged. The preference of a greater adjustment to $V_{BB}$ versus $V_{DD}$ arises from the observation that by increasing $V_{BB}$, power consumption is reduced both by reducing current leakage and providing a total overall reduction in power available to drive core 14$_x$. Lastly, recalling that controller 26' may operate in alternative embodiments with respect to either a single core or multiple cores when analyzing speed capability of those cores from the signal $f_{Sx}$, then similarly controller 26' may operate in alternative embodiments with respect to one ore more leakage monitor indications and resulting changes may be made to either global or local values of $V_{DD}$ and $V_{BB}$.

Having now demonstrated preferred embodiment considerations of adjusting $V_{DD}$ and/or $V_{BB}$ in response to either or both of $f_{Sx}$ and $f_{Lx}$, recall further the example with respect to FIG. 1, wherein clock speed is increased over that obtainable by a nominal external voltage level subject to the voltage losses described above. In view thereof, one skilled in the art may also combine all of these aspects so that various adjustments may be made and specifications may be altered in view of any one or more of $f_{Sx}$ and $f_{Lx}$ with various improvements in performance and/or efficiency.

While the preceding has described preferred embodiments that adjust $V_{DD}$ and/or $V_{BB}$ in response to either or both of $f_{Sx}$ and $f_{Lx}$, the present inventive scope contemplates that other system parameters that are dynamically alterable also may be changed so as to affect the operation of a critical path and in response to either or both of $f_{Sx}$ and $f_{Lx}$. For example, an additional system parameter is the clock speed provided by system clock 20 or 20'. In other words, in an alternative embodiment that speed may be made to be adjustable in response to either or both of $f_{Sx}$ and $f_{Lx}$. To illustrate this point, consider again the earlier example at a first time, $t_1$, wherein $f_{Sx}$ indicates a speed capability of frequency at 500 MHz, while at the same time assume that the system clock frequency indicates a then-existing core operational frequency of 250 MHz. Rather than adjusting $V_{DD}$, or in combination with adjusting $V_{DD}$, in an alternative embodiment the system clock frequency may be adjusted according to these indications. For example, in one approach, $V_{DD}$ may be left at its then-current level, while system clock 20 (or 20') is controlled so that the clock speed is increased toward, or all the way to, a value of 500 MHz. In this manner, the core operational frequency is raised toward that of the perceived capable speed of 500 MHz, the latter of which is provided by $f_{Sx}$. Thus, in this approach, assuming $V_{DD}$ is not changed, then energy consumption is not reduced at time $t_1$, but performance is enhanced by increasing clock speed while leaving $V_{DD}$ and $V_{BB}$ undisturbed. Further, this adjustment may be combined with an adjustment to $V_{DD}$ and/or $V_{BB}$ for further optimization as may be desired. Also in connection with the preceding, it is noted that certain considerations may dictate a preference in some implementations of adjusting one system parameter or parameters while not changing others. For example, in contemporary applications, often an original equipment manufacturer or the like may specify certain parameters that may not be changed, for instance desiring that clock speed be left solely in control of their software. In such a case, dynamically altering the system clock as just described may not be preferable or permissible. In other instances, however, it may prove beneficial, particularly for speed demanding applications. Lastly, note that while the present document has described alterations in the system parameters consisting of $V_{DD}$, $V_{BB}$, and clock speed, one skilled in the art may ascertain other system parameters that may be dynamically adjusted in response to $f_{Sx}$ and/or $f_{Lx}$ with beneficial results and consistent with the present inventive scope.

Having detailed various aspects, including alternatives with respect to, systems 10 and 10', attention is now returned to yet additional considerations that may be applied as relating to preferred embodiment implementations of a speed capability indicator $22_x$ (e.g., either $22_1$ or $22_2$). Specifically, FIG. 5 illustrates a block diagram of a general architecture that may be used to form speed capability indicator $22_x$ as a ring oscillator. Speed capability indicator $22_x$ preferably includes three (or some other number) like constructed blocks connected in a serial path and with a feedback from the output of the last block in the path to the input of the first block in the path. Thus, in FIG. 5, three such blocks $22_{xA}$, $22_{xB}$, and $22_{xC}$ are shown in serial order, that is, with the output of block $22_{xA}$ connected to the input of block $22_{xB}$, with the output of block $22_{xB}$ connected to the input of block $22_{xC}$, and with the output of block $22_{xC}$ providing the above-detailed output frequency, $f_{Sx}$, and also being fed back to the input of block $22_{xA}$. Each of blocks $22_{xA}$, $22_{xB}$, and $22_{xC}$ is shown in general to receive and, hence, to respond to, the two system voltages $V_{DD}$ and $V_{BB}$. Thus, each block operates in response to those voltages and provides an output, and due to the ring nature of the FIG. 5 configuration, a transition from one block in the ring is provided to a next block in the ring which also transitions and so forth continuing in a ring manner, so as to ultimately produce a steady-state or oscillation frequency that is presented in the output frequency, $f_{Sx}$. Further in this regard, the particular design of the schematic within each of blocks $22_{xA}$, $22_{xB}$, and $22_{xC}$ is detailed below, where one skilled in the art should anticipate from the earlier discussion of speed capability indicator $22_x$ as a whole that the schematic is selected so as to model a voltage/frequency response similar to one or more critical paths $CP_x$ within a core $14_x$ to which speed capability indicator $22_x$ corresponds.

Before proceeding with a discussion of the detailed implementation within each of blocks $22_{xA}$, $22_{xB}$, and $22_{xC}$ a preliminary discussion is noteworthy with respect to the preferred embodiment manner of identifying a data path and its respective voltage/frequency characteristics that blocks $22_{xA}$, $22_{xB}$, and $22_{xC}$ will seek to mimic. The preferred embodiment recognizes that often a circuit, such as a core $14_x$, may have numerous possible data paths that potentially provide the most restrictive delay through the circuit. In other words, certain data paths through the circuit will be suspected as the most restrictive (i.e., causing the most delay), but indeed out of numerous candidate data paths, it may be cost and/or time prohibitive to consider all of these potential data paths in determining which is the most restrictive. Thus, in the preferred embodiment, and preferably using the same design software and hardware that designs core $14_x$ itself, an appropriate algorithm, and having access to the core network node listings or the like, is operable to identify a reasonable number of data paths where each is a candidate that may represent the most restrictive delay through core $14_x$, that is, the true critical path through core $14_x$. Such software and hardware are readily ascertainable by one skilled in the art, and will generally include some type of data storage facility to store the network node listings or other machine-readable circuit description as well as a processor and other supporting circuitry so as to run adequate circuit design, analysis, and simulation software. In any event, once these candidate data paths are identified, the preferred embodiment proceeds to select one as the critical path as further described below.

FIG. 6 illustrates a graph having voltage along its horizontal axis and delay along its vertical axis. Further, within the graph are five plots numbered $P_1$ through $P_5$. These five plots represent voltage/frequency characteristics of five data paths in core $14_x$ that are identified by the preferred embodiment as potentially the most restrictive in core $14_x$. With this identification and then with a simulation of the voltage/frequency characteristics of each such as shown in FIG. 6, then the most restrictive may be readily selected and thereby deemed to be the critical path $CP_x$. For the sake of simplifying the present example, each plot $P_x$ is shown to be linear, where in actual implementation such plots may be curved to various extents. Looking in more detail at each plot $P_x$, each is intended to illustrate the voltage/frequency behavior of the five identified data paths through a core $14_x$, where that behavior may be based on one or both of the system voltages $V_{DD}$ and $V_{BB}$. Further in this regard, recall from earlier that in the preferred embodiment, speed capability indicator $22_x$ is constructed and operates in response to system voltages $V_{DD}$ and $V_{BB}$ to provide resultant voltage and frequency characteristics that in general mimic the voltage and frequency characteristics of a critical path $CP_x$ in a corresponding core $14_x$. Accordingly, the voltage of the horizontal axis in FIG. 6 represents either or both of these system voltages. Rather than illustrating the plots in terms of frequency, and for sake of simplifying the present discussion, each plot $P_x$ is shown with reference to the delay of each such corresponding data path, where delay as known in the art is merely the reciprocal of frequency. Thus, note that a discussion of a voltage/delays characteristic is therefore understood by one skilled in the art to be equally representative of the voltage/frequency characteristics, where of course one has an opposite slope to the other due to the reciprocal relationship between delay and frequency. Accordingly, for each plot $P_x$ in FIG. 6, it may be readily appreciated that at lower voltages, there is generally a greater delay for each path than at higher voltages, where stating the same principle with respect to frequency means that at lower voltages, there is generally a lower frequency for the path than at higher voltages.

Given FIG. 6 and the understanding that the preferred embodiment algorithm identifies a group of candidate data paths and provides an expected voltage/delay plot $P_x$ for each such path, then also under the preferred embodiment the data path out of those candidates and having the greatest delay is selected as the probable critical path $CP_x$ for core $14_x$. Thus, in the illustration of FIG. 6, the uppermost one of the plots, namely plot $P_1$, represents this chosen data path as its plot suggests the greatest amount of delay. This choice is made because the greatest delay indicates a greater likelihood that the data path corresponding to plot $P_1$ is the most restrictive in the core $14_x$ to which the path belongs and, hence, it is thus most probable to accurately reflect the true critical path in that core. With this selection, the preferred embodiment, and again preferably using an automated flow algorithm that includes a network node listing or the like of the selected data path, then endeavors to provide design parameters for a schematic to be used as a speed capability indicator $22_x$ circuit that provides similar voltage/delay characteristics as represented by the plot (e.g., $P_1$) for the selected data path. The specific schematic to which these design parameters apply is further appreciated below.

FIG. 7 illustrates a schematic of a preferred implementation for each of blocks $22_{xA}$, $22_{xB}$, and $22_{xC}$ of FIG. 5, where the above-discussed design parameters are applied to the schematic to ultimately provide speed capability indicator $22_x$. For sake of example, only one block $22_{xA}$ is shown in FIG. 7, with an understanding that preferably the same schematic is duplicated in each of blocks $22_{xB}$ and $22_{xC}$ so as to provide a ring oscillator as described above with respect to FIG. 5. Looking then to the schematic of FIG. 7, block $22_{xA}$ includes an input $22_{xA\_IN}$ that is connected to an input of an inverter 80. The output of inverter 80 is connected to both inputs of a two-input NAND gate 82. The output of NAND gate 82 is connected to a node 84. Node 84 is connected to a first terminal of a capacitive element 86, which has its second terminal connected to ground. Node 84 is also connected to a switched RC (i.e., resistor/capacitor) device 88 which, as further described below, has an RC delay that is adjusted in response to a power supply or supplies. Toward this end, device 88 includes an n-channel transistor $88_T$ having its drain connected to node 84 and its source connected to a first terminal of a capacitor $88_C$, where the second terminal of capacitor $88_C$ is connected to ground. Also with respect to n-channel transistor $88_T$, its gate is connected to $V_{DD}$, and optionally its backgate is connected to $V_{BB}$. As further discussed below, therefore, the extent to which node 84 is loaded with an RC value from device 88 depends on the voltage provided by $V_{DD}$, and also by that supplied by $V_{BB}$ if it is also included as shown in FIG. 7.

Continuing with the schematic of block $22_{xA}$ in FIG. 7, node 84 is also connected to an input of an inverter 92. The output of inverter 92 is connected to both inputs of a two-input NOR gate 92. The output of NOR gate 92 is connected to a node 94. Node 94 is connected to a first terminal of a capacitive element 96, which has its second terminal connected to ground. Node 94 is also connected to a switched RC device 98, which is comparable to switched RC device connected to node 84. Thus, device 98 includes an n-channel transistor $98_T$ having its drain connected to node 94, its source connected to a first terminal of a capacitor $98_C$ that has its second terminal connected to ground, its gate is connected to $V_{DD}$, and optionally its backgate connected to $V_{BB}$. Node 94 is also connected to an input of an inverter 98. The output of inverter 98 provides the output, $22_{xA\_OUT}$, of block $22_{xA}$.

Having discussed the specific connections of block $22_{xA}$, attention is directed to the considerations that make it a preferable design to form a block that is duplicated to provide a speed capability indicator $22_x$. In this regard, in the preferred embodiment it is desired to have block $22_{xA}$ include at least one circuit element of each type that is included in the path that is identified as the critical path based on that path's delay/voltage characteristic as discussed above in connection with FIG. 6. In other words, given a critical path, the preferred embodiment seeks to simulate each building block of that path, with the expectation that the total voltage/delay characteristics of that path should derived from the voltage/delay characteristics of each of its components. Thus, to the extent that the identified probable critical path includes logic functions such as AND and OR, those functions are also included individually in the schematic of FIG. 7. For example, if there are one or more AND gates in the critical path, then the AND function is preferably provided in block $22_{xA}$ by a single AND function. As another example, if there are one or more OR gates in the critical path, then the OR function is preferably provided in block $22_{xA}$ by a single OR function. Further in this regard and with respect to the AND function as well as the OR function, generally it is understood that the counterpart NOR function has a maximum delay for a low transitioning signal and the NAND function has a maximum delay for a high transition signal; thus, the NAND and NOR functions, rather than the counterpart OR and AND functions, are implemented in block $22_{xA}$, as shown by NAND gate 82 and NOR gate 92 in FIG. 7. With respect to the inversions in the critical path, they are represented in FIG. 7 by inverters 80, 90, and 102.

Continuing with the preferred design considerations for block $22_{xA}$ of FIG. 7, note that it also includes various devices so as to simulate the effect of the parasitic resistive and capacitive elements of the identified critical path that block $22_{xA}$ seeks to mimic. In other words, the components of block $22_{xA}$ that are discussed in the preceding paragraph have explicit schematic counterparts, albeit in a larger quantity, in the identified critical path $CP_x$. The remaining devices in FIG. 7, however, are instead included to mimic the effect of parasitic effects in the corresponding and identified critical path $CP_x$. For example, recall that node 84 is connected to both a capacitive element 86 as well as switched RC device 88. Looking now in more detail to these devices, as a general matter it may be seen that the capacitive aspects of capacitive element 86 as well as switched RC device 88 are generally connected in parallel between node 84 and ground. With respect to switched RC device 88, its operation may be appreciated by considering two instances. In one instance where the difference between $V_{DD}$ and $V_{BB}$ is relatively large, then transistor $88_T$ will present node 84 with a relatively low resistance, thereby causing a larger amount of the capacitance of capacitive element $88_C$ to load node 84 and to add this larger amount of capacitance to the capacitance of the parallel-connected capacitive element 86. Conversely, in another instance when the difference between $V_{DD}$ and $V_{BB}$ is relatively small, then transistor $88_T$ will present node 84 with a relatively large resistance, thereby limiting the amount of capacitance from capacitive element $88_C$ that loads node 84 and thereby adding a lesser amount of capacitance to the parallel-connected capacitive element 86. Note also that RC device 98 operates in a comparable manner with respect to node 94. Lastly, the overall effect of these capacitance contributions will be more readily apparent from the following operational description of block $22_{xA}$ of FIG. 7.

The operation of block $22_{xA}$ of FIG. 7 is now described. Looking first to inverters 80, 90, and 98, the serial path between them and the other gates connected in that path ensure an oscillating signal. As a first example, consider the case when a low signal is provided at input $22_{xA\_IN}$ and thus to the input of inverter 80. In response, inverter 80 outputs a high signal, and that high signal is connected to both inputs of NAND gate 82, thereby causing a low output from NAND gate 82. The low output of NAND gate 82 is inverted to a high by inverter 90 and connected to both inputs of NOR gate 92, thereby causing NOR gate 92 to output a low output. The low output of NOR gate 92 is inverted by inverter 100 to a high at output $22_{xA\_OUT}$; thus, in this first case, the low signal at input $22_{xA\_IN}$ is converted to a high signal at output $22_{xA\_OUT}$, thereby providing a transition which may be repeated to provide an oscillating signal (i.e., $f_{Sx}$). As a next example, consider the case when a high signal is provided at input $22_{xA\_IN}$ and thus to the input of inverter 80. In response, inverter 80 outputs a low signal, and that low signal is connected to both inputs of NAND gate 82, thereby causing a high output from NAND gate 82. The high output of NAND gate 82 is inverted to a low by inverter 90 and connected to both inputs of NOR gate 92, thereby causing NOR gate 92 to output a high output. The high output of NOR gate 92 is inverted by inverter 100 to a low at output $22_{xA\_OUT}$; thus, in this second case, the high signal at input $22_{xA\_IN}$ is converted to a low signal at output $22_{xA\_OUT}$, thereby providing a transition which may be repeated to provide an oscillating signal (i.e., $f_{Sx}$). Also from the above, it may be seen that by replicating block $22_{xA}$ in each of blocks $22_{xB}$ and $22_{xC}$ and given the feedback path from the output of block $22_{xC}$ to the input of block $22_{xA}$, the signal path will continuously transition back and forth, at a frequency dictated by the delay through each block.

Recalling that the preferred embodiment provides a voltage/delay (or voltage/frequency) characteristic in block $22_{xA}$ (along with blocks $22_{xB}$ and $22_{xC}$) to mimic that of an identified critical path $CP_x$, the delay imposed by block $22_{xA}$ is now explored in additional detail. First in this regard, with respect to the logic functions of block $22_{xA}$ recall from earlier that an automated flow algorithm per the preferred embodiment provides design parameters in view of the selected plot $P_1$, and note now that these parameters are used to determine the preferred transistor parameters used to construct the schematic of FIG. 7. Further in this endeavor, note that the size of each of the transistors used to construct these devices may be adjusted so as to cause the overall voltage/delay characteristics of block $22_{xA}$ to contribute to speed capability indicator $22_x$ so that the voltage/delay characteristics of the latter approaches that of the identified critical path $CP_x$. Thus, in response to software simulations these transistor sizes may be automatically ascertained so as to approximate in the FIG. 7 schematic the same delays as existing in the critical path $CP_x$. Further, the delay of block $22_{xA}$ is also affected by switched RC devices 88 and 98. In this regard, recall that generally a large $V_{DD}$ (or difference between $V_{DD}$ and $V_{BB}$) causes each of devices 88 and 98 to provide a larger capacitive contribution to a respective node 84 and 94. In addition to that consideration, note now that in general, a large $V_{DD}$ (or difference between $V_{DD}$ and $V_{BB}$) also would cause the remaining logic circuits within block $22_{xA}$ to operate faster, if they were not loaded with additional circuitry; however, the inclusion of RC switched devices 88 and 98 negates or offsets at least in part this tendency so as to provide a more balanced voltage/delay characteristics of block $22_{xA}$ so that it better approximates that of the corresponding critical path $CP_x$. Specifically, with a large $V_{DD}$ (or difference between $V_{DD}$ and $V_{BB}$), the tendency of the logic gates to increase operational frequency is negated in part by the larger capacitive contribution by switched RC devices 88 and 98. Conversely, with a lesser $V_{DD}$ large $V_{DD}$ (or difference between $V_{DD}$ and $V_{BB}$), the tendency of the logic gates to decrease operational frequency is negated in part by the reduced capacitive contribution by switched RC devices 88 and 98. These offsets, therefore, effectively permit the slope of the voltage/delay characteristics of block $22_{xA}$ to be adjusted so as to be appropriately sensitive to changes in $V_{DD}$ (and $V_{BB}$), and to thereby acceptably mimic the same voltage/delay characteristic changes that occur in corresponding critical path $CP_x$ in response to changes in $V_{DD}$ (and $V_{BB}$).

The preceding illustration and discussion of FIGS. 5 through 7 demonstrate various criteria and software simulation for designing a speed capability indicator $22_x$, but recall further that in the preferred embodiment speed capability indicator $22_x$ is a tunable circuit. More specifically and as is now explored in greater detail, provisions are made so that after the semiconductor device that includes the relevant core(s) and speed capability indicator $22_x$ is constructed, it may be tested and additional tuning (or "trimming") may be made to the circuit so as to further refine its voltage/delay (or voltage/frequency) characteristics to duplicate those of a corresponding critical path $CP_x$. Note that such post-fabrication testing and trimming may be performed for each individual integrated circuit, or possibly more practical in many instances may be an evaluation of a small percentage of integrated circuits in a larger group or lot, with adjustments made to all circuits in that group based on an analysis of the distribution of differences between the voltage/delay characteristics of the critical paths and speed capability indicators for the evaluated small percentage of integrated circuits. In either event, the preferred manner of post-fabrication trimming is further explored below.

Figure 8A:
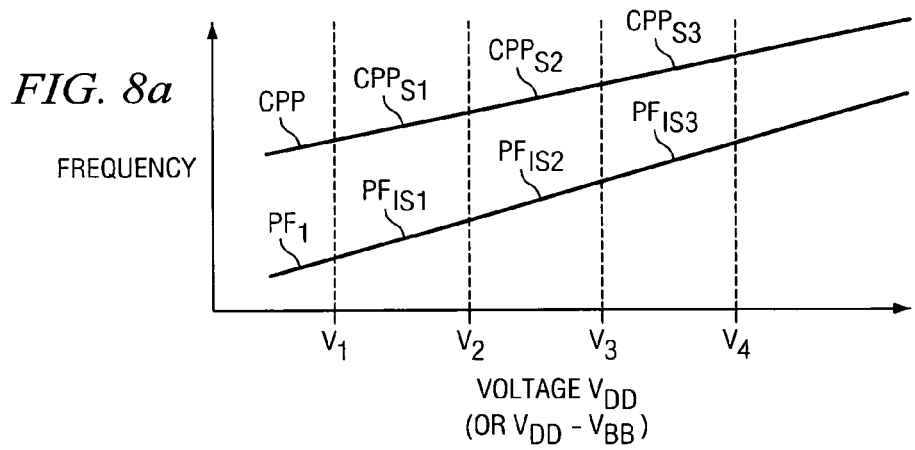
FIG. 8a illustrates a graph having voltage along its horizontal axis and frequency along its vertical axis, and it further illustrates a plot CPP as the voltage/frequency characteristics of a critical path $CP_x$ and a plot $PF_1$ as the voltage/frequency characteristics of a speed capability indicator $22_x$ that is attempting to match the characteristics of that critical path $CP_x$.

FIG. 8a illustrates a graph having voltage along its horizontal axis and frequency along its vertical axis; thus, in contrast to FIG. 6 described above, FIG. 8a illustrates frequency, rather than its reciprocal of delay. Further, FIG. 8a is intended to illustrate the test-measured voltage/frequency characteristics of two circuits, namely, a first plot CPP is the voltage/frequency characteristic of a critical path $CP_x$ and a second plot $PF_1$ is the voltage/frequency characteristic of a speed capability indicator $22_x$ that is attempting to match the characteristics of that critical path $CP_x$. Note that if fabrication occurred in an ideal manner, then plot $PF_1$ in FIG. 8a will correspond to the reciprocal of the voltage/delay of plot $P_1$ from FIG. 6 since plot $P_1$ in FIG. 6 was chosen as the targeted voltage/delay characteristics for speed capability indicator $22_x$. However, due to various factors known in the semiconductor fabrication art, the actual post-fabrication voltage/delay or voltage/frequency characteristics of speed capability indicator $22_x$ may differ from the intended characteristics.

Continuing with an examination of FIG. 8a, it is further intended to illustrate an example wherein, despite the best efforts of the design criteria and software simulations and algorithms mentioned above, a difference occurs between plots CPP and $PF_1$. Thus, while the intended goal was a match of these two plots, and hence the voltage/frequency characteristics represented by each, the illustration represents a difference between the slopes as well as the magnitude of delay for each plot. This difference is not necessarily drawn to scale, but instead it is shown to an extent to better illustrate the present aspect. In any event, due to the difference, without any further steps per the preferred embodiment, then reliance on the speed capability indicator $22_x$ that operates per plot $PF_1$ to predict the behavior of the critical path $CP_x$ that operates per plot CPP would lead to an inaccuracy in that prediction because the two plots differ to a certain extent. According to the preferred embodiment, however, the inclusion of a mechanism for post-fabrication tuning or trimming permits a reduction in this difference, thereby further enhancing the performance of the energy control that occurs in response to the indication of speed capability indicator $22_x$, as further appreciated below.

Figure 8B:
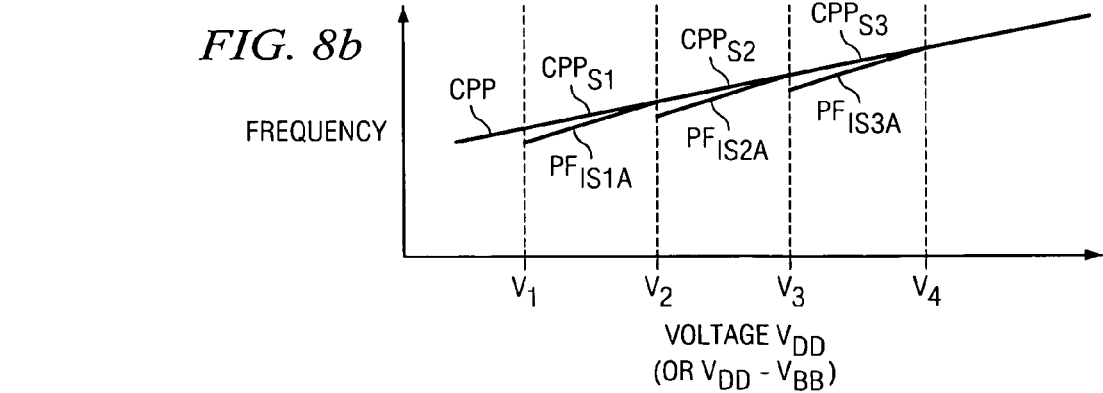
FIG. 8b illustrates the graph of FIG. 8a after adjustments are made to plot $PF_1$ so as to better match it to the voltage/frequency characteristics of the corresponding critical path $CP_x$.

In the preferred embodiment, the difference between plots CPP and $PF_1$ is tuned with adjustments corresponding to segments of those two plots, as is now further explored in connection with both FIG. 8a and FIG. 8b. Particularly, in FIG. 8a, four different voltages, $V_1$, $V_2$, $V_3$, and $V_4$ are indicated, where those voltage may be chosen in various manners such as by identifying equally spaced voltage regions along the expected voltage operational range for critical path $CP_x$. Between each adjacent pair of these voltages, each plot has a corresponding segment. For example, between voltages $V_1$ and $V_2$, plot CPP has a segment $CPP_{S1}$, and plot $PF_1$ has a segment $PF_{1S1}$. Looking now to FIG. 8b, the same voltages and segments are shown, but FIG. 8b illustrates the segments of plot $PF_1$ after each has been tuned so that each segment much more closely approaches the respective segment of plot CPP. The slope of each segment $PF_{1S1}$, $PF_{1S2}$, and $PF_{1S3}$, of plot $PF_1$ is unchanged, but each such segment is moved closer to the corresponding segment in plot CPP. In the preferred embodiment, this movement of each segment is achieved using a numeric offset for each segment. Specifically, with the plots in FIG. 8a, the frequency difference between two plots at a given voltage is readily obtainable. For example, assume that a frequency difference $FD_4$ exists at voltage $V_4$ in FIG. 8a as between plots CPP and $PF_1$. Further, recall from FIG. 3 that the preferred embodiment measures frequency by counting frequency transitions through counter 32b over a period of time. Thus, in the preferred embodiment the difference $FD_4$ in frequency between the two plot segments at voltage $V_4$ is represented by a count that would occur if the difference in the two frequencies were counted over the same time period as a cycle of counts by counter 32b. In other words, assume at voltage $V_4$ that plot CPP has a frequency $f_{4.1}$ and assume also at voltage $V_4$ that plot $PF_1$ has a frequency $f_{4.2}$. Thus, the difference between frequencies $f_{4.1}$ and $f_{4.2}$ may be determined, and that frequency if counted over a period of time corresponds to a numeric count. According to the preferred embodiment, this count is used as a numeric offset, such as by adding it to counter 32b by way of example or counter 32b could be pre-loaded with that count each time it is reset. Alternatively, where the preferred embodiment counting is achieved with an up-down counter as mentioned earlier, then the offset may be used as an initial value in the up-down-counter. In any case, therefore, this offset number may be stored into a programmable storage device or the like so that it may included in the total count Looking at a specific example of an offset that may be implemented in this manner, in the FIG. 8a case illustrated for segment $PF_{1S3}$, it is seen visually that its depicted frequency is lower than the actual frequency of the corresponding critical path as shown in segment $CPP_{S3}$; thus, the numeric offset corresponding to the frequency difference determined between the two at voltage $V_4$ is added to the count in counter 32b when the system voltage (or voltage difference) at issue is between voltages $V_3$ and $V_4$. By operating in this manner, segment $PF_{1S3}$ of FIG. 8a is effectively adjusted and is shown as an adjusted segment $PF_{1S3A}$ at the raised location shown in FIG. 8b. Thus, in FIG. 8b, there is a closer match of segment $PF_{1S3A}$ to segment $CPP_{S3}$, that is, the voltage/delay characteristics provided by segment $PF_{1S3A}$ are indeed closer to segment $CPP_{S3}$ in FIG. 8b as compared to FIG. 8a, indicating that the speed capability indicator $22_x$, as offset and reflected by segment $PF_{1S3A}$, is very closely predicting the voltage/frequency characteristics of the critical path $CP_x$ represented by segment $CPP_{S3}$.

Completing the discussion of FIGS. 8a and 8b, note that the numeric offset mentioned above is preferably repeated for each set of segments between a same voltage range, preferably by evaluating the offset at the higher voltage for the set of segments. Thus, for segments $CPP_{S2}$ and $PF_{1S2}$ between voltages $V_2$ and $V_3$, each segment at voltage $V_3$ has a frequency $f_{3.1}$ and $f_{3.2}$, respectively, with a difference between those frequencies. Per the preferred embodiment, this difference is determined as a numeric count that represents that frequency if counted over a period of time, and that count is used as an offset to add to the counts provided by speed capability indicator $22_x$ for voltages between $V_2$ and $V_3$. Thus, segment $PF_{1S2}$ of FIG. 8a is effectively adjusted and is shown as an adjusted segment $PF_{1S2A}$ at the raised location shown in FIG. 8b, again providing a closer match between the predicted performance as provided by segment $PF_{1S2A}$ and the actual performance of critical path $CP_x$ as represented by segment $CPP_{S2}$. From the preceding, one skilled in the art will appreciate that the same methodology is used for segments $PF_{1S1}$ and $CPP_{S1}$ between voltages $V_1$ and $V_2$, and indeed this methodology also may be used for any number of additional segments if a greater number of ranges are desired.

From the above, it may be appreciated that the preferred embodiments provide an integrated circuit speed capability indicator that under operation provides voltage/delay (or voltage/frequency) characteristic that mimic the same characteristics of a corresponding data path, such as a critical path in a larger circuit such as a circuit core. With this indicator, the expected operational attributes of the corresponding data path may be predicted, as may be helpful in various contexts. In one particularly beneficial context, the integrated circuit speed capability indicator is used in an integrated circuit dynamic parameter management structure and methodology that may be used with numerous electronic circuits. In one approach, the preferred embodiment permits an increase in the system voltage above a nominal value that was previously used and which limited a comparable device to a lower clock speed. Additionally, the preferred embodiments also have particular application to improve performance control in circuits with decreased transistor geometries. More particularly, as transistor geometries decrease, it has been observed by the present inventors that a global reduction in $V_{DD}$ as frequency decreases, as implemented in the prior art, may actually increase overall energy consumption, such as by increasing device leakage. In contrast, certain preferred embodiments provide for alterations in device parameters, such as both $V_{DD}$ and $V_{BB}$, including in view of the then-resulting leakage, so these adjustments are made to counteract any tendency toward increased leakage. As a result, greater improvements in energy consumption can be achieved. As another benefit, greater performance and power efficiency may be realized for a given device size and complexity. As still another benefit, battery-powered devices may support complex operations with a lesser penalty on energy consumption, having application in numerous contemporary devices including those with multiple cores, those support multimedia applications, and so forth. As still another benefit, in alternative embodiments other device parameters may be adjusted in response to a dynamic evaluation of critical path speed capability and/or device leakage, where by way of example one such parameter is an adjustment of system clock speed.

In addition to the preceding benefits, the preferred embodiments also have benefit in devices having varying operational characteristics in a single yield of such devices. In other words, it is known in the manufacturing art that for a group of devices, certain ones of those devices may perform more optimally than others. The prior art uses various approaches to deal with this reality, including by way of example setting certain operational characteristics for the entire group as limited by the lesser performing devices. However, at least with respect to control of various system parameters (e.g., $V_{DD}$, $V_{BB}$, clock speed), the preferred embodiments may be implemented in an entire group of such devices, allowing each device in that group to dynamically self-adjust its values of $V_{DD}$ and $V_{BB}$ (or other parameters, including frequency) consistent with the above teachings, thereby permitting different devices from the same group to operate at different system voltages, yielding improved individual operation from device to device as compared to scaling the entire set of devices to accommodate a worst case scenario provided by the lesser performing devices in the yield. Thus, the optimal $V_{DD}$ and $V_{BB}$ may differ from chip architecture to chip architecture, from process node to process node, and also with temperature.

As another benefit of those preferred embodiments that adjust $V_{DD}$ and/or $V_{BB}$, note that in the past, certain integrated circuit manufacturers have taken a conservative approach in evaluating a lot of devices and then providing operational voltage and frequency specifications according to certain assumptions from the overall results of the lot; often these assumptions typically include worst-case scenarios, such as what performance is achievable from the lower quality silicon in the lot with a fixed voltage supply. As such, often a resulting operational frequency is specified at a corresponding provided fixed system voltage, with both corresponding to a specified amount of power consumption. Thus, devices from the same lot that may have a higher quality silicon are constrained to operate under these lower performance specifications, when in fact some of these devices are capable of operating more efficiently (e.g., higher speeds and/or less energy consumption). However, with the preferred embodiments, and given the ability to dynamically adjust the values of $V_{DD}$ and/or $V_{BB}$ and/or clock speed in response to operational speed capacity and current leakage, then at the same nominal amount of power consumption of the fixed voltage case, greater operational frequencies may be achieved.

From the above, the preferred embodiments provide an overall improvement is not only power management as it relates to provided voltage, but also to energy efficiency in that leakage is also improved and also to performance in that higher frequencies may be achieved at a same level of power consumption used by slower performing devices in the prior art. As another benefit of the preferred embodiments, it has been shown that various substitutions, modifications or alterations could be made to the descriptions set forth above without departing from the inventive scope. Consequently, while the present embodiments have been described in detail, that inventive scope is further intended to include the variations shown herein by example and ascertainable by one skilled in the art, as further is defined by the following claims.

The invention claimed is:

1. An electronic system, comprising:
   circuitry for receiving a system voltage from a voltage supply;
   circuitry, responsive to the system voltage, for providing data processing functionality, wherein the circuitry for providing data processing functionality comprises a critical path and wherein the critical path comprises a plurality of transistors, wherein at least some transistors in the plurality of transistors have a corresponding predetermined voltage operating limit;
   circuitry for indicating a potential capability of operational speed of the critical path;
   circuitry for coupling the system voltage to the critical path; and
   circuitry for adjusting the system voltage, as provided by the voltage supply, in response to the circuitry for indicating a potential capability;
   wherein in selected instances the circuitry for adjusting adjusts the voltage supplied by the voltage supply to be a voltage greater than the predetermined voltage operating limit;
   wherein the system is on a single integrated circuit;
   wherein each transistor in the plurality of transistors has a gate length of 90 nanometers;
   wherein a single integrated circuit comprises the circuitry for indicating a potential capability and the critical path; and
   wherein a distance between the circuitry for indicating the potential capability and the critical path is no greater than 100 microns apart on the single integrated circuit.

2. The system of claim 1 wherein said some transistors include p-channel transistors and n-channel transistors and the system further comprising circuitry for adjusting separate back bias voltages, one for the p-channel transistors and one for the n-channel transistors.

3. The system of claim 2 wherein the circuitry for providing data processing functionality, the circuitry for indicating a potential capability of operational speed of the critical path, and the circuitry for adjusting are integrated in a single integrated circuit device.

4. The system of claim 3 wherein the voltage supply is external with respect to the single integrated circuit device.

5. The system of claim 4 wherein the system voltage supplied by the voltage supply incurs losses when coupled to the critical path by the circuitry for coupling such that a corresponding voltage when reaching the critical path is less than the voltage supplied by the system voltage supply.

6. The system of claim 3 wherein the voltage supply is also integrated within the single integrated circuit device.

7. The system of claim 6 wherein the system voltage supplied by the voltage supply incurs losses when coupled to the critical path by the circuitry for coupling such that a corresponding voltage when reaching the critical path is less than the voltage supplied by the system voltage supply.

8. The system of claim 7:
   wherein the circuitry for providing data processing functionality is further responsive to a system clock; and
   wherein the circuitry for adjusting comprises circuitry for comparing the signal representing the potential capability of operational speed with the system clock as it switched over a first time period.

9. The system of claim 1 wherein the circuitry for indicating a potential capability of operational speed of the critical path operates at a speed in response to the system voltage and outputs a signal representing the potential capability of operational speed.

10. The system of claim 1:
wherein the circuitry for indicating a potential capability further operates in response to a back bias voltage; and
wherein in selected instances the circuitry for adjusting is for causing an increase in the system voltage and a decrease in the back bias voltage in response to the system clock exceeding the signal representing the potential capability of operational speed.

11. The system of claim 1:
wherein the circuitry for indicating a potential capability further operates in response to a back bias voltage; and
wherein in selected instances the circuitry for adjusting is for causing a decrease in the system voltage and an increase in a back bias voltage in response to the signal, representing the potential capability of operational speed, exceeding the system clock.

12. The system of claim 1 and further comprising circuitry for indicating an amount of current leakage of the circuitry for providing data processing functionality, wherein the circuitry for adjusting is for adjusting the system voltage further in response to the circuitry for indicating an amount of current leakage.

13. The system of claim 1:
wherein the critical path operates at a speed at least in part in response to the system clock; and
wherein the circuitry for indicating a potential capability of operational speed of the critical path operates at a speed that is not in response to the system clock.

14. The system of claim 1 wherein the circuitry for indicating a potential capability comprises an approximate square layout on an integrated circuit.

15. The system of claim 1 wherein the circuitry for providing a data processing functionality comprises circuitry for providing a mobile phone data processing functionality.

16. The system of claim 1 wherein the circuitry for providing a data processing functionality is selected from a set consisting of a microprocessor and a digital signal processor.

17. The system of claim 1 wherein the critical path comprises a first critical path and wherein the circuitry for indicating a potential capability of operational speed comprises a first circuitry for indicating a potential capability of operational speed, and further comprising:
a plurality of critical paths, including the first critical path;
a plurality of circuitries, including the first circuitry for indicating a potential capability of operational speed, wherein each circuit in the plurality of circuitries, is for indicating a potential capability of operational speed of a respective critical path in the plurality of critical paths; and
wherein the circuitry for adjusting the system voltage is further responsive to each circuit in the plurality of circuitries.

18. The system of claim 1 wherein the circuitry for adjusting is for periodically adjusting the system voltage.

19. The system of claim 1 wherein the system voltage is selected from a set consisting of VDD and a back bias voltage.

20. The system of claim 1 the system voltage is a difference between a supply voltage and a reference voltage.

21. The system of claim 1 the system voltage is a difference between a supply voltage and a reference voltage of ground.

* * * * *